(12) United States Patent
Marx et al.

(10) Patent No.: US 9,425,328 B2
(45) Date of Patent: Aug. 23, 2016

(54) THROUGH SILICON VIA INCLUDING MULTI-MATERIAL FILL

(71) Applicant: Fairchild Semiconductor Corporation, San Jose, CA (US)

(72) Inventors: David Lambe Marx, Pleasanton, CA (US); Brian Bircumshaw, Oakland, CA (US); Janusz Bryzek, Oakland, CA (US)

(73) Assignee: Fairchild Semiconductor Corporation, San Jose, CA (US)

( * ) Notice: Subject to any disclaimer, the term of this patent is extended or adjusted under 35 U.S.C. 154(b) by 120 days.

(21) Appl. No.: 14/023,869

(22) Filed: Sep. 11, 2013

(65) Prior Publication Data

US 2014/0070339 A1 Mar. 13, 2014

Related U.S. Application Data

(60) Provisional application No. 61/700,186, filed on Sep. 12, 2012.

(51) Int. Cl.
*H01L 29/84* (2006.01)
*B81B 7/00* (2006.01)
(Continued)

(52) U.S. Cl.
CPC ............. *H01L 29/84* (2013.01); *B81B 7/007* (2013.01); *B81B 7/0041* (2013.01); *B81B 7/02* (2013.01); *G01P 15/125* (2013.01); *G01P 15/18* (2013.01);
(Continued)

(58) Field of Classification Search
CPC ...... H01L 29/84; H01L 23/481; G01P 15/18; G01P 15/125; B81B 7/0041; B81B 7/007
See application file for complete search history.

(56) References Cited

U.S. PATENT DOCUMENTS 3,231,729 A    1/1966 Stern
4,896,156 A    1/1990 Garverick
(Continued)

FOREIGN PATENT DOCUMENTS

CN    1068444 A    1/1993
CN    1198587 A    11/1998
(Continued)

OTHER PUBLICATIONS

"U.S. Appl. No. 12/849,742, Notice of Allowance mailed Nov. 29, 2013", 7 pgs.
(Continued)

*Primary Examiner* — Joseph C Nicely
(74) *Attorney, Agent, or Firm* — Schwegman Lundberg & Woessner, P.A.

(57) ABSTRACT

An apparatus includes a substrate having at least one via disposed in the substrate, wherein the substrate includes a trench having a substantially trapezoidal cross-section, the trench extending through the substrate between a lower surface of the substrate and an upper surface of the substrate, wherein the top of the trench opens to a top opening, and the bottom of the trench opens to a bottom opening, the top opening being larger than the bottom opening. The apparatus can include a mouth surrounding the top opening and extending between the upper surface and the top opening, wherein a mouth opening in the upper surface is larger than the top opening of the trench, wherein the via includes a dielectric layer disposed on an inside surface of a trench. The apparatus includes and a fill disposed in the trench, with the dielectric layer sandwiched between the fill and the substrate.

22 Claims, 13 Drawing Sheets

(51) Int. Cl.
  *H01L 23/48* (2006.01)
  *G01P 15/18* (2013.01)
  *G01P 15/125* (2006.01)
  *B81B 7/02* (2006.01)

(52) U.S. Cl.
  CPC ...... *H01L 23/481* (2013.01); *B81B 2201/0235* (2013.01); *B81B 2207/096* (2013.01); *H01L 2924/0002* (2013.01)

(56) References Cited

U.S. PATENT DOCUMENTS

| | | |
|---|---|---|
| 5,487,305 A | 1/1996 | Ristic et al. |
| 5,491,604 A | 2/1996 | Nguyen et al. |
| 5,600,064 A | 2/1997 | Ward |
| 5,656,778 A | 8/1997 | Roszhart |
| 5,723,790 A | 3/1998 | Andersson |
| 5,751,154 A | 5/1998 | Tsugai |
| 5,760,465 A | 6/1998 | Alcoe et al. |
| 5,765,046 A | 6/1998 | Watanabe et al. |
| 5,894,091 A | 4/1999 | Kubota |
| 5,912,499 A | 6/1999 | Diem et al. |
| 6,131,457 A | 10/2000 | Sato |
| 6,214,644 B1 | 4/2001 | Glenn |
| 6,236,096 B1 | 5/2001 | Chang et al. |
| 6,301,965 B1 | 10/2001 | Chu et al. |
| 6,351,996 B1 | 3/2002 | Nasiri et al. |
| 6,366,468 B1 | 4/2002 | Pan |
| 6,390,905 B1 | 5/2002 | Korovin et al. |
| 6,501,282 B1 | 12/2002 | Dummermuth et al. |
| 6,504,385 B2 | 1/2003 | Hartwell |
| 6,553,835 B1 | 4/2003 | Hobbs et al. |
| 6,722,206 B2 | 4/2004 | Takada |
| 6,725,719 B2 | 4/2004 | Cardarelli |
| 6,737,742 B2 | 5/2004 | Sweterlitsch |
| 6,781,231 B2 | 8/2004 | Minervini et al. |
| 6,848,304 B2 | 2/2005 | Geen |
| 7,051,590 B1 | 5/2006 | Lemkin et al. |
| 7,054,778 B2 | 5/2006 | Geiger et al. |
| 7,093,487 B2 | 8/2006 | Mochida |
| 7,166,910 B2 | 1/2007 | Minervini et al. |
| 7,202,552 B2 | 4/2007 | Zhe et al. |
| 7,210,351 B2 | 5/2007 | Lo et al. |
| 7,221,767 B2 | 5/2007 | Mullenborn et al. |
| 7,240,552 B2 | 7/2007 | Acar et al. |
| 7,258,011 B2 | 8/2007 | Nasiri et al. |
| 7,258,012 B2 | 8/2007 | Xie et al. |
| 7,266,349 B2 | 9/2007 | Kappes |
| 7,293,460 B2 | 11/2007 | Zarabadi et al. |
| 7,301,212 B1 | 11/2007 | Mian et al. |
| 7,305,880 B2 | 12/2007 | Caminada et al. |
| 7,358,151 B2 | 4/2008 | Araki et al. |
| 7,436,054 B2 | 10/2008 | Zhe |
| 7,449,355 B2 | 11/2008 | Lutz et al. |
| 7,451,647 B2 | 11/2008 | Matsuhisa et al. |
| 7,454,967 B2 | 11/2008 | Skurnik |
| 7,518,493 B2 | 4/2009 | Bryzek et al. |
| 7,539,003 B2 | 5/2009 | Ray |
| 7,544,531 B1 | 6/2009 | Grosjean |
| 7,595,648 B2 | 9/2009 | Ungaretti et al. |
| 7,600,428 B2 | 10/2009 | Robert et al. |
| 7,616,078 B2 | 11/2009 | Prandi et al. |
| 7,622,782 B2 | 11/2009 | Chu et al. |
| 7,694,563 B2 | 4/2010 | Durante et al. |
| 7,706,149 B2 | 4/2010 | Yang et al. |
| 7,781,249 B2 | 8/2010 | Laming et al. |
| 7,795,078 B2 | 9/2010 | Ramakrishna et al. |
| 7,851,925 B2 | 12/2010 | Theuss et al. |
| 7,859,352 B2 | 12/2010 | Sutton |
| 7,950,281 B2 | 5/2011 | Hammerschmidt |
| 8,004,354 B1 | 8/2011 | Pu et al. |
| 8,006,557 B2 | 8/2011 | Yin et al. |
| 8,037,755 B2 | 10/2011 | Nagata et al. |
| 8,113,050 B2 | 2/2012 | Acar et al. |
| 8,171,792 B2 | 5/2012 | Sameshima |
| 8,201,449 B2 | 6/2012 | Ohuchi et al. |
| 8,250,921 B2 | 8/2012 | Nasiri et al. |
| 8,256,290 B2 | 9/2012 | Mao |
| 8,375,789 B2 | 2/2013 | Prandi et al. |
| 8,421,168 B2 | 4/2013 | Allen et al. |
| 8,476,970 B2 | 7/2013 | Mokhtar et al. |
| 8,508,290 B2 | 8/2013 | Elsayed et al. |
| 8,643,382 B2 | 2/2014 | Steele et al. |
| 8,710,599 B2 * | 4/2014 | Marx et al. ................... 257/417 |
| 8,739,626 B2 | 6/2014 | Acar |
| 8,742,964 B2 | 6/2014 | Kleks et al. |
| 8,754,694 B2 | 6/2014 | Opris et al. |
| 8,813,564 B2 | 8/2014 | Acar |
| 8,978,475 B2 * | 3/2015 | Acar ........................ 73/514.32 |
| 9,003,882 B1 | 4/2015 | Ayazi et al. |
| 9,006,846 B2 | 4/2015 | Bryzek et al. |
| 9,095,072 B2 | 7/2015 | Bryzek et al. |
| 2002/0021059 A1 | 2/2002 | Knowles et al. |
| 2002/0117728 A1 | 8/2002 | Brosnihhan et al. |
| 2002/0178831 A1 | 12/2002 | Takada |
| 2002/0189352 A1 | 12/2002 | Reeds, III et al. |
| 2002/0196445 A1 | 12/2002 | Mcclary et al. |
| 2003/0038415 A1 | 2/2003 | Anderson et al. |
| 2003/0061878 A1 | 4/2003 | Pinson |
| 2003/0200807 A1 | 10/2003 | Hulsing, II |
| 2003/0222337 A1 | 12/2003 | Stewart |
| 2004/0085784 A1 | 5/2004 | Salama et al. |
| 2004/0119137 A1 | 6/2004 | Leonardi et al. |
| 2004/0177689 A1 | 9/2004 | Cho |
| 2004/0211258 A1 | 10/2004 | Geen |
| 2004/0219340 A1 | 11/2004 | McNeil et al. |
| 2004/0231420 A1 | 11/2004 | Xie et al. |
| 2004/0251793 A1 | 12/2004 | Matushisa |
| 2005/0005698 A1 | 1/2005 | McNeil et al. |
| 2005/0097957 A1 | 5/2005 | Mcneil et al. |
| 2005/0139005 A1 | 6/2005 | Geen |
| 2005/0189635 A1 | 9/2005 | Humpston et al. |
| 2005/0274181 A1 | 12/2005 | Kutsuna et al. |
| 2006/0032308 A1 | 2/2006 | Acar et al. |
| 2006/0034472 A1 | 2/2006 | Bazarjani et al. |
| 2006/0043608 A1 | 3/2006 | Bernier et al. |
| 2006/0097331 A1 | 5/2006 | Hattori |
| 2006/0112764 A1 | 6/2006 | Higuchi |
| 2006/0137457 A1 | 6/2006 | Zdeblick |
| 2006/0207328 A1 | 9/2006 | Zarabadi et al. |
| 2006/0213265 A1 | 9/2006 | Weber et al. |
| 2006/0213266 A1 | 9/2006 | French et al. |
| 2006/0213268 A1 | 9/2006 | Asami et al. |
| 2006/0246631 A1 * | 11/2006 | Lutz et al. ................... 438/127 |
| 2006/0283245 A1 | 12/2006 | Konno et al. |
| 2007/0013052 A1 | 1/2007 | Zhe et al. |
| 2007/0034005 A1 | 2/2007 | Acar et al. |
| 2007/0040231 A1 | 2/2007 | Harney et al. |
| 2007/0042606 A1 | 2/2007 | Wang et al. |
| 2007/0047744 A1 | 3/2007 | Karney et al. |
| 2007/0071268 A1 | 3/2007 | Harney et al. |
| 2007/0085544 A1 | 4/2007 | Viswanathan |
| 2007/0099327 A1 | 5/2007 | Hartzell et al. |
| 2007/0113653 A1 | 5/2007 | Nasiri et al. |
| 2007/0114643 A1 | 5/2007 | DCamp et al. |
| 2007/0165888 A1 | 7/2007 | Weigold |
| 2007/0205492 A1 | 9/2007 | Wang |
| 2007/0220973 A1 | 9/2007 | Acar |
| 2007/0222021 A1 | 9/2007 | Yao |
| 2007/0284682 A1 | 12/2007 | Laming et al. |
| 2008/0049230 A1 | 2/2008 | Chin et al. |
| 2008/0079444 A1 | 4/2008 | Denison |
| 2008/0081398 A1 | 4/2008 | Lee et al. |
| 2008/0083958 A1 | 4/2008 | Wei et al. |
| 2008/0083960 A1 | 4/2008 | Chen et al. |
| 2008/0092652 A1 | 4/2008 | Acar |
| 2008/0122439 A1 | 5/2008 | Burdick et al. |
| 2008/0157238 A1 | 7/2008 | Hsiao |
| 2008/0157301 A1 | 7/2008 | Ramakrishna et al. |
| 2008/0169811 A1 | 7/2008 | Viswanathan |
| 2008/0202237 A1 | 8/2008 | Hammerschmidt |
| 2008/0245148 A1 | 10/2008 | Fukumoto |
| 2008/0247585 A1 | 10/2008 | Leidl et al. |
| 2008/0251866 A1 | 10/2008 | Belt et al. |

(56) References Cited

U.S. PATENT DOCUMENTS

| | | |
|---|---|---|
| 2008/0290756 A1 | 11/2008 | Huang |
| 2008/0302559 A1 | 12/2008 | Leedy |
| 2008/0314147 A1 | 12/2008 | Nasiri |
| 2009/0007661 A1 | 1/2009 | Nasiri et al. |
| 2009/0064780 A1 | 3/2009 | Coronato et al. |
| 2009/0072663 A1 | 3/2009 | Ayazi et al. |
| 2009/0114016 A1 | 5/2009 | Nasiri et al. |
| 2009/0140606 A1 | 6/2009 | Huang |
| 2009/0166827 A1 | 7/2009 | Foster et al. |
| 2009/0175477 A1 | 7/2009 | Suzuki et al. |
| 2009/0183570 A1 | 7/2009 | Acar et al. |
| 2009/0194829 A1 | 8/2009 | Chung et al. |
| 2009/0263937 A1 | 10/2009 | Ramakrishna et al. |
| 2009/0266163 A1 | 10/2009 | Ohuchi et al. |
| 2010/0019393 A1 | 1/2010 | Hsieh et al. |
| 2010/0024548 A1 | 2/2010 | Cardarelli |
| 2010/0038733 A1 | 2/2010 | Minervini |
| 2010/0044853 A1 | 2/2010 | Dekker et al. |
| 2010/0052082 A1 | 3/2010 | Lee |
| 2010/0058864 A1 | 3/2010 | Hsu et al. |
| 2010/0072626 A1 | 3/2010 | Theuss et al. |
| 2010/0089154 A1 | 4/2010 | Ballas et al. |
| 2010/0122579 A1 | 5/2010 | Hsu et al. |
| 2010/0126269 A1 | 5/2010 | Coronato et al. |
| 2010/0155863 A1 | 6/2010 | Weekamp |
| 2010/0206074 A1 | 8/2010 | Yoshida et al. |
| 2010/0212425 A1 | 8/2010 | Hsu et al. |
| 2010/0224004 A1 | 9/2010 | Suminto et al. |
| 2010/0236327 A1 | 9/2010 | Mao et al. |
| 2011/0023605 A1 | 2/2011 | Tripoli et al. |
| 2011/0030473 A1 | 2/2011 | Acar |
| 2011/0030474 A1 | 2/2011 | Kuang et al. |
| 2011/0031565 A1* | 2/2011 | Marx et al. .................. 257/417 |
| 2011/0094302 A1 | 4/2011 | Schofield et al. |
| 2011/0120221 A1 | 5/2011 | Yoda |
| 2011/0121413 A1 | 5/2011 | Allen et al. |
| 2011/0146403 A1 | 6/2011 | Rizzo Piazza Roncoroni et al. |
| 2011/0147859 A1* | 6/2011 | Tanaka et al. ............... 257/415 |
| 2011/0201197 A1* | 8/2011 | Nilsson et al. ............... 438/638 |
| 2011/0265564 A1 | 11/2011 | Acar et al. |
| 2011/0285445 A1 | 11/2011 | Huang et al. |
| 2011/0316048 A1 | 12/2011 | Ikeda et al. |
| 2012/0126349 A1* | 5/2012 | Horning et al. ............. 257/417 |
| 2012/0326248 A1* | 12/2012 | Daneman et al. ........... 257/415 |
| 2013/0139591 A1 | 6/2013 | Acar |
| 2013/0139592 A1 | 6/2013 | Acar |
| 2013/0192364 A1* | 8/2013 | Acar ......................... 73/504.12 |
| 2013/0192369 A1* | 8/2013 | Acar et al. ................ 73/514.01 |
| 2013/0221457 A1 | 8/2013 | Conti et al. |
| 2013/0247666 A1* | 9/2013 | Acar ......................... 73/514.01 |
| 2013/0247668 A1* | 9/2013 | Bryzek ...................... 73/514.35 |
| 2013/0250532 A1 | 9/2013 | Bryzek et al. |
| 2013/0257487 A1 | 10/2013 | Opris et al. |
| 2013/0263641 A1 | 10/2013 | Opris et al. |
| 2013/0263665 A1 | 10/2013 | Opris et al. |
| 2013/0265070 A1 | 10/2013 | Kleks et al. |
| 2013/0265183 A1 | 10/2013 | Kleks et al. |
| 2013/0268227 A1 | 10/2013 | Opris et al. |
| 2013/0268228 A1 | 10/2013 | Opris et al. |
| 2013/0269413 A1 | 10/2013 | Tao et al. |
| 2013/0270657 A1* | 10/2013 | Acar ........................... 257/415 |
| 2013/0270660 A1 | 10/2013 | Bryzek et al. |
| 2013/0271228 A1 | 10/2013 | Tao et al. |
| 2013/0277772 A1* | 10/2013 | Bryzek ....................... 257/415 |
| 2013/0277773 A1 | 10/2013 | Bryzek et al. |
| 2013/0298671 A1 | 11/2013 | Acar et al. |
| 2013/0328139 A1* | 12/2013 | Acar ........................... 257/415 |
| 2013/0341737 A1 | 12/2013 | Bryzek et al. |
| 2014/0275857 A1* | 9/2014 | Toth et al. ................... 600/301 |
| 2015/0059473 A1 | 3/2015 | Jia |
| 2015/0114112 A1 | 4/2015 | Valzasina et al. |
| 2015/0321904 A1 | 11/2015 | Bryzek et al. |

FOREIGN PATENT DOCUMENTS

| | | |
|---|---|---|
| CN | 1221210 A | 6/1999 |
| CN | 1389704 A | 1/2003 |
| CN | 1617334 A | 5/2005 |
| CN | 1659810 A | 8/2005 |
| CN | 1813192 A | 8/2006 |
| CN | 1816747 A | 8/2006 |
| CN | 1886669 A | 12/2006 |
| CN | 1905167 A | 1/2007 |
| CN | 1948906 A | 4/2007 |
| CN | 101038299 A | 9/2007 |
| CN | 101067555 A | 11/2007 |
| CN | 101069099 A | 11/2007 |
| CN | 101171665 A | 4/2008 |
| CN | 101180516 A | 5/2008 |
| CN | 101239697 A | 8/2008 |
| CN | 101257000 A | 9/2008 |
| CN | 101270988 A | 9/2008 |
| CN | 101316462 A | 12/2008 |
| CN | 101426718 A | 5/2009 |
| CN | 101459866 A | 6/2009 |
| CN | 101519183 A | 9/2009 |
| CN | 101638211 A | 2/2010 |
| CN | 101813480 A | 8/2010 |
| CN | 101858928 A | 10/2010 |
| CN | 101916754 A | 12/2010 |
| CN | 102337541 A | 2/2012 |
| CN | 102364671 A | 2/2012 |
| CN | 102597699 A | 7/2012 |
| CN | 103209922 A | 7/2013 |
| CN | 103210278 A | 7/2013 |
| CN | 103221331 A | 7/2013 |
| CN | 103221332 A | 7/2013 |
| CN | 103221333 A | 7/2013 |
| CN | 103221778 A | 7/2013 |
| CN | 103221779 A | 7/2013 |
| CN | 103221795 A | 7/2013 |
| CN | 103238075 A | 8/2013 |
| CN | 103363969 A | 10/2013 |
| CN | 103363983 A | 10/2013 |
| CN | 103364590 A | 10/2013 |
| CN | 103364593 A | 10/2013 |
| CN | 103368503 A | 10/2013 |
| CN | 103368562 A | 10/2013 |
| CN | 103368577 A | 10/2013 |
| CN | 103376099 A | 10/2013 |
| CN | 103376102 A | 10/2013 |
| CN | 103403495 A | 11/2013 |
| CN | 203275441 U | 11/2013 |
| CN | 203275442 U | 11/2013 |
| CN | 103663344 A | 3/2014 |
| CN | 203683082 U | 7/2014 |
| CN | 203719664 U | 7/2014 |
| CN | 104094084 A | 10/2014 |
| CN | 104105945 A | 10/2014 |
| CN | 104220840 A | 12/2014 |
| CN | 104272062 A | 1/2015 |
| DE | 112011103124 T5 | 12/2013 |
| DE | 102013014881 A1 | 3/2014 |
| EP | 1460380 A1 | 9/2004 |
| EP | 1521086 A1 | 4/2005 |
| EP | 1688705 A2 | 8/2006 |
| EP | 1832841 A1 | 9/2007 |
| EP | 1860402 A1 | 11/2007 |
| EP | 2053413 A1 | 4/2009 |
| EP | 2259019 A1 | 12/2010 |
| JP | 09089927 A | 4/1997 |
| JP | 10239347 A | 9/1998 |
| JP | 2005024310 A | 1/2005 |
| JP | 2005114394 A | 4/2005 |
| JP | 2005294462 A | 10/2005 |
| JP | 2007024864 A | 2/2007 |
| JP | 2008294455 A | 12/2008 |
| JP | 2009075097 A | 4/2009 |
| JP | 2009186213 A | 8/2009 |
| JP | 2010025898 A | 2/2010 |
| JP | 2010506182 A | 2/2010 |
| KR | 1020110055449 A1 | 5/2011 |

(56) References Cited

FOREIGN PATENT DOCUMENTS

| KR | 1020130052652 A | 5/2013 |
| KR | 1020130052653 A | 5/2013 |
| KR | 1020130054441 A | 5/2013 |
| KR | 1020130055693 A | 5/2013 |
| KR | 1020130057485 A | 5/2013 |
| KR | 1020130060338 A | 6/2013 |
| KR | 1020130061181 A | 6/2013 |
| KR | 101311966 B1 | 9/2013 |
| KR | 1020130097209 A | 9/2013 |
| KR | 101318810 B1 | 10/2013 |
| KR | 1020130037462 A | 10/2013 |
| KR | 1020130112789 A | 10/2013 |
| KR | 1020130112792 A | 10/2013 |
| KR | 1020130112804 A | 10/2013 |
| KR | 1020130113385 A | 10/2013 |
| KR | 1020130113386 A | 10/2013 |
| KR | 1020130113391 A | 10/2013 |
| KR | 1020130116189 A | 10/2013 |
| KR | 1020130116212 A | 10/2013 |
| KR | 101332701 B1 | 11/2013 |
| KR | 1020130139914 A | 12/2013 |
| KR | 1020130142116 A | 12/2013 |
| KR | 101352827 B1 | 1/2014 |
| KR | 1020140034713 A | 3/2014 |
| TW | I255341 B | 5/2006 |
| WO | WO-9311415 A1 | 6/1993 |
| WO | WO-9503534 A1 | 2/1995 |
| WO | WO-0175455 A2 | 10/2001 |
| WO | WO-2008059757 A1 | 5/2008 |
| WO | WO-2008087578 A2 | 7/2008 |
| WO | WO-2009050578 A2 | 4/2009 |
| WO | WO-2009156485 A1 | 12/2009 |
| WO | WO-2011016859 A2 | 2/2011 |
| WO | WO-2011016859 A3 | 2/2011 |
| WO | WO-2012037492 A2 | 3/2012 |
| WO | WO-2012037492 A3 | 3/2012 |
| WO | WO-2012037501 A2 | 3/2012 |
| WO | WO-2012037501 A3 | 3/2012 |
| WO | WO-2012037536 A2 | 3/2012 |
| WO | WO-2012037537 A2 | 3/2012 |
| WO | WO-2012037538 A2 | 3/2012 |
| WO | WO 2012037538 A2 * | 3/2012 |
| WO | WO-2012037539 A1 | 3/2012 |
| WO | WO 2012037539 A1 * | 3/2012 |
| WO | WO-2012037539 A9 | 3/2012 |
| WO | WO-2012037540 A2 | 3/2012 |
| WO | WO 2012037540 A2 * | 3/2012 |
| WO | WO-2012040194 A1 | 3/2012 |
| WO | WO 2012040194 A1 * | 3/2012 |
| WO | WO-2012040211 A2 | 3/2012 |
| WO | WO-2012040245 A2 | 3/2012 |
| WO | WO-2012040245 A3 | 3/2012 |
| WO | WO-2013115967 A1 | 8/2013 |
| WO | WO-2013116356 A1 | 8/2013 |
| WO | WO-2013116514 A1 | 8/2013 |
| WO | WO-2013116522 A1 | 8/2013 |

OTHER PUBLICATIONS

"U.S. Appl. No. 12/849,787, Notice of Allowance mailed Dec. 11, 2013", 9 pgs.
"U.S. Appl. No. 13/362,955, Response filed Feb. 17, 2014 to Restriction Requirement mailed Dec. 17, 2013", 9 pgs.
"U.S. Appl. No. 13/362,955, Restriction Requirement mailed Dec. 17, 2013", 6 pgs.
"U.S. Appl. No. 13/363,537, Non Final Office Action mailed Feb. 6, 2014", 10 pgs.
"U.S. Appl. No. 13/742,942, Notice of Allowance mailed Jan. 28, 2014", 9 pgs.
"U.S. Appl. No. 13/746,016, Notice of Allowance mailed Jan. 17, 2014", 10 pgs.
"U.S. Appl. No. 13/755,841, Restriction Requirement mailed Feb. 21, 2014", 6 pgs.
"Chinese Application Serial No. 201180053926.1, Office Action mailed Jan. 13, 2014", 7 pgs.
"Chinese Application Serial No. 201180054796.3, Office Action mailed Jan. 16, 2014", 8 pgs.
"Chinese Application Serial No. 201180055029.4, Office Action mailed Jan. 13, 2014", 7 pgs.
"Chinese Application Serial No. 201320172366.8, Office Action mailed Oct. 25, 2013", 8 pgs.
"Chinese Application Serial No. 201320172366.8, Response filed Dec. 24, 2013 to Office Action mailed Oct. 25, 2013", 11 pgs.
"Chinese Application Serial No. 201320565239.4, Office Action mailed Jan. 16, 2014", w/English Translation, 3 pgs.
"European Application Serial No. 10806751.3, Extended European Search Report mailed Jan. 7, 2014", 7 pgs.
"Korean Application Serial No. 10-2013-0109990, Amendment filed Dec. 10, 2013", 4 pgs.
"Korean Application Serial No. 10-2013-7009775, Office Action mailed Dec. 27, 2013", 8 pgs.
"Korean Application Serial No. 10-2013-7009775, Response filed Oct. 29, 2013 to Office Action mailed Sep. 17, 2013", w/English Claims, 23 pgs.
"Korean Application Serial No. 10-2013-7009777, Office Action mailed Jan. 27, 2014", 5 pgs.
"Korean Application Serial No. 10-2013-7009777, Response filed Nov. 5, 2013 to Office Action mailed Sep. 17, 2013", 11 pgs.
"Korean Application Serial No. 10-2013-7009788, Office Action mailed Dec. 27, 2013", w/English Translation, 10 pgs.
"Korean Application Serial No. 10-2013-7009788, Response filed Oct. 29, 2013 to Office Action mailed Aug. 29, 2013", w/English Claims, 22 pgs.
"U.S. Appl. No. 13/362,955, Notice of Allowance mailed Feb. 25, 2015", 8 pgs.
"U.S. Appl. No. 13/362,955, Response filed Jan. 16, 2015 to Final Office Action mailed Nov. 19. 2014", 9 pgs.
"U.S. Appl. No. 13/363,537, Corrected Notice of Allowance mailed Jan. 28, 2015", 2 pgs.
"U.S. Appl. No. 13/742,994, Non Final Office Action mailed May 1, 2015", 20 pgs.
"U.S. Appl. No. 13/755,953, Response filed May 4, 2015 to Restrictiion Requirement mailed Mar. 3, 2015", 7 pgs.
"U.S. Appl. No. 13/755,953, Restriction Requirement mailed Mar. 3, 2015", 6 pgs.
"U.S. Appl. No. 13/765,068, Notice of Allowance mailed May 7, 2015", 12 pgs.
"U.S. Appl. No. 13/813,443, Restriction Requirement mailed Apr. 29, 2015", 6 pgs.
"U.S. Appl. No. 13/821,586, Non Final Office Action mailed Jan. 15, 2015", 8 pgs.
"U.S. Appl. No. 13/821,589, Final Office Action mailed Mar. 12, 2015", 13 pgs.
"U.S. Appl. No. 13/821,598, Response filed Feb. 20, 2015 to Non Final Office Action mailed Nov. 20, 2014", 12 pgs.
"U.S. Appl. No. 13/821,609, Notice of Allowance mailed Mar. 23, 2015", 11 pgs.
"U.S. Appl. No. 13/821,609, Response filed Feb. 13, 2015 to Restriction Requirement mailed Dec. 15, 2014", 6 pgs.
"U.S. Appl. No. 13/821,609, Restriction Requirement mailed Dec. 15, 2014", 7 pgs.
"U.S. Appl. No. 13/821,612, Notice of Allowance mailed Dec. 10, 2014", 8 pgs.
"U.S. Appl. No. 13/821,842, Non Final Office Action mailed Mar. 18, 2015", 20 pgs.
"U.S. Appl. No. 13/821,853, Non Final Office Action mailed Feb. 18, 2015", 15 pgs.
"U.S. Appl. No. 13/821,853, Response filed Dec. 1, 2014 to Non Final Office Action mailed Jul. 30, 2014", 10 pgs.
"U.S. Appl. No. 13/860,761, Advisory Action mailed Mar. 25, 2015", 3 pgs.
"U.S. Appl. No. 13/860,761, Final Office Action mailed Jan. 15, 2015", 14 pgs.
"U.S. Appl. No. 13/860,761, Notice of Allowance mailed Apr. 28, 2015", 8 pgs.
"U.S. Appl. No. 13/860,761, Response filed Mar. 16, 2015 to Final Office Action mailed Jan. 16, 2015", 12 pgs.

(56) References Cited

OTHER PUBLICATIONS

"U.S. Appl. No. 13/860,761, Response filed Apr. 16, 2015 to Advisory Action mailed Mar. 25, 2015", 11 pgs.

"U.S. Appl. No. 13/860,761, Response filed Dec. 19, 2014 to Non Final Office Action mailed Aug. 19, 2014", 12 pgs.

"U.S. Appl. No. 14/658,579, Prliminary Amendment filed Mar. 18, 2015", 8 pgs.

"Chinese Application Serial No. 2010800423190, Office Action mailed Dec. 3, 2014", 3 pgs.

"Chinese Application Serial No. 2010800423190, Response filed Feb. 15, 2015", 3 pgs.

"Chinese Application Serial No. 201180054796.3, Office Action mailed Jan. 30, 2015", with English translation of claims, 5 pgs.

"Chinese Application Serial No. 201180054796.3, Response filed Nov. 19, 2014 to Office Action mailed Sep. 4, 2014", with English translation of claims, 7 pgs.

"Chinese Application Serial No. 201180054796.3, Response filed Apr. 14, 2015 to Office Action mailed Jan. 30, 2015", w/ English Claims, 30 pgs.

"Chinese Application Serial No. 201180055309.5, Office Action mailed Jan. 8, 2015", with English translation of claims, 5 pgs.

"Chinese Application Serial No. 201180055309.5, Response filed Jan. 14, 2015 to Office Action mailed Jan. 8, 2015", 8 pgs.

"Chinese Application Serial No. 201180055630.3, Office Action mailed Dec. 22, 2014", with English translation of claims, 10 pgs.

"Chinese Application Serial No. 201180055630.3, Response filed Apr. 20, 2015 to Office Action mailed Dec. 22, 2014", w/ English Claims, 10 pgs.

"Chinese Application Serial No. 201180055792.7, Office Action mailed Dec. 22, 2014", with English translation of claims, 10 pgs.

"Chinese Application Serial No. 201180055794.6, Office Action mailed Dec. 17, 2014", with English translation of claims, 9 pgs.

"Chinese Application Serial No. 201180055823.9, Office Action mailed Mar. 19, 2015", w/ English Claims, 8 pgs.

"Chinese Application Serial No. 201180055845.5, Office Action mailed Mar. 4, 2015", w/ English Claims, 8 pgs.

"Chinese Application Serial No. 2013101188456, Response filed Jan. 21, 2015", with English translation of claims, 16 pgs.

"Chinese Application Serial No. 201310119472.4, Response filed Jan. 21, 2015", with English translation of claims, 16 pgs.

"Chinese Application Serial No. 201380007588.7, Response filed Oct. 24, 2014", with English translation, 3 pgs.

"Chinese Application Serial No. 201380007615.0, Response filed Oct. 24, 2014", with English translation, 3 pgs.

"European Application Serial No. 11826067.8, Response filed Apr. 27, 2015 to Extended European Search Report mailed Oct. 6, 2014", 32 pgs.

"European Application Serial No. 11826068.6, Response filed Feb. 9, 2015", 30 pgs.

"European Application Serial No. 11826071.0, Examination Notification Art. 94(3) mailed Dec. 11, 2014", 4 pgs.

"European Application Serial No. 11826071.0, Response filed Apr. 13, 2015 to Examination Notification Art. 94(3) mailed Dec. 11, 2014", 5 pgs.

"European Application Serial No. 13001695.9, Extended European Search Report mailed Jan. 22, 2015", 8 pgs.

"European Application Serial No. 13001719.7, Response filed Jan. 21, 2015", 29 pgs.

"U.S. Appl. No. 13/362,955, Final Office Action mailed Nov. 19, 2014", 5 pgs.

"U.S. Appl. No. 13/362,955, Response filed Aug. 15, 2014 to Non Final Office Action mailed May 15, 2014", 13 pgs.

"U.S. Appl. No. 13/363,537, Examiner Interview Summary mailed Sep. 29, 2014", 3 pgs.

"U.S. Appl. No. 13/363,537, Notice of Allowance mailed Nov. 7, 2014", 5 pgs.

"U.S. Appl. No. 13/363,537, Response filed Sep. 29, 2014 to Final Office Action mailed Jun. 27, 2014", 9 pgs.

"U.S. Appl. No. 13/821,586, Response filed Nov. 24, 2014 to Restriction Requirement mailed Sep. 22, 2014", 6 pgs.

"U.S. Appl. No. 13/821,586, Restriction Requirement mailed Sep. 22, 2014", 4 pgs.

"U.S. Appl. No. 13/821,589, Response filed Nov. 10, 2014 to Non Final Office Action mailed Jul. 9, 2014", 15 pgs.

"U.S. Appl. No. 13/821,598, Non Final Office Action mailed Nov. 20, 2014", 9 pgs.

"U.S. Appl. No. 13/821,598, Response filed Oct. 15, 2014 to Restriction Requirement mailed Aug. 15, 2014", 8 pgs.

"U.S. Appl. No. 13/821,612, Response filed Oct. 23, 2014 to Non Final Office Action mailed Jul. 23, 2014", 6 pgs.

"Chinese Application Serial No. 201180054796.3, Office Action mailed Sep. 4, 2014", w/English Claims, 11 pgs.

"Chinese Application Serial No. 201180055029.4, Response filed Nov. 14, 2014 to Office Action mailed Jul. 2, 2014", w/English Claims, 23 pgs.

"Chinese Application Serial No. 201310118845.6, Office Action mailed Sep. 9, 2014", 8 pgs.

"Chinese Application Serial No. 201310119472.4, Office Action mailed Sep. 9, 14", w/English Translation, 11 pgs.

"European Application Serial No. 11826043.9, Office Action mailed May 6, 2013", 2 pgs.

"European Application Serial No. 11826043.9, Response filed Nov. 4, 2013 to Office Action mailed May 6, 2013", 6 pgs.

"European Application Serial No. 11826067.8, Extended European Search Report mailed Oct. 6, 2014", 10 pgs.

"European Application Serial No. 11826070.2, Response filed Sep. 19, 2014 to Office Action mailed Mar. 12, 2014", 11 pgs.

"European Application Serial No. 11826071.0, Response filed Sep. 19, 2014 to Office Action mailed Mar. 12, 2014", 20 pgs.

"European Application Serial No. 11827347.3, Office Action mailed May 2, 2013", 6 pgs.

"European Application Serial No. 11827347.3, Response filed Oct. 30, 2013 to Office Action mailed May 2, 2013", 9 pgs.

"European Application Serial No. 11827384.6, Extended European Search Report mailed Nov. 12, 2014", 6 pgs.

"European Application Serial No. 13001695.9, European Search Report mailed Oct. 5, 2014", 6 pgs.

Dunn, C, et al., "Efficient linearisation of sigma-delta modulators using single-bit dither", Electronics Letters 31(12), (Jun. 1995), 941-942.

Kulah, Haluk, et al., "Noise Analysis and Characterization of a Sigma-Delta Capacitive Silicon Microaccelerometer", 12th International Conference on Solid State Sensors, Actuators and Microsystems, (2003), 95-98.

Sherry, Adrian, et al., "AN-609 Application Note: Chopping on Sigma-Delta ADCs", Analog Devices, [Online]. Retrieved from the Internet: <URL:http://www.analog.com/static/imported-files/application_notes/AN-609.pdf>, (2003), 4 pgs.

"U.S. Appl. No. 12/849,742, Supplemental Notice of Allowability mailed Mar. 17, 2014", 3 pgs.

"U.S. Appl. No. 12/849,742, Supplemental Notice of Allowability mailed May 5, 2014", 2 pgs.

"U.S. Appl. No. 12/849,787, Supplemental Notice of Allowability mailed Mar. 21, 2014", 3 pgs.

"U.S. Appl. No. 13/362,955, Non Final Office Action mailed Apr. 15, 2014", 9 pgs.

"U.S. Appl. No. 13/363,537, Response filed Jun. 6, 2014 to Non Final Office Action mailed Feb. 6, 2014", 11 pgs.

"U.S. Appl. No. 13/742,942, Supplemental Notice of Allowability mailed Apr. 10, 2014", 2 pgs.

"U.S. Appl. No. 13/755,841, Notice of Allowance mailed May 7, 2014", 8 pgs.

"U.S. Appl. No. 13/755,841, Preliminary Amendment filed Oct. 10, 2013", 10 pgs.

"U.S. Appl. No. 13/755,841, Response filed Apr. 21, 2014 to Restriction Requirement mailed Feb. 21, 2014", 7 pgs.

"Application Serial No. 13/821,589, Restriction Requirement mailed Apr. 11, 2014", 10 pgs.

"Chinese Application Serial No. 2010800423190, Office Action mailed Mar. 26, 2014", 10 pgs.

"Chinese Application Serial No. 201180053926.1, Response filed Apr. 29, 2014 to Office Action mailed Jan. 13, 2014", w/English Claims, 10 pgs.

(56) References Cited

OTHER PUBLICATIONS

"Chinese Application Serial No. 201180055029.4, Response filed May 27, 2014 to Office Action mailed Jan. 13, 2014", w/English Claims, 29 pgs.
"Chinese Application Serial No. 201180055309.5, Office Action mailed Mar. 31, 2014", w/English Claims, 7 pgs.
"Chinese Application Serial No. 201320172366.8, Office Action mailed Jan. 30, 2014", w/English Claims, 3 pgs.
"Chinese Application Serial No. 201320172366.8, Response filed Mar. 18, 2014 to Office Action mailed Jan. 30, 2014", w/English Claims, 20 pgs.
"Chinese Application Serial No. 201320565239.4, Response filed Mar. 31, 2014 to Office Action mailed Jan. 16, 2014", w/English Claims, 38 pgs.
"European Application Serial No. 118260070.2, Office Action mailed Mar. 12, 2014", 1 pg.
"European Application Serial No. 11826070.2, Extended European Search Report mailed Feb. 21, 2014", 5 pgs.
"European Application Serial No. 11826071.0, Extended European Search Report mailed Feb. 20, 2014", 6 pgs.
"European Application Serial No. 11826071.0, Office Action mailed Mar. 12, 2014", 1 pg.
"European Application Serial No. 13001692.6, Response filed Apr. 1, 2014 to Extended European Search Report mailed Jul. 24, 2013", 19 pgs.
"European Application Serial No. 13001721.3, Response filed Apr. 7, 2014 to Extended European Search Report mailed Jul. 18, 2013", 25 pgs.
"Korean Application Serial No. 10-2013-7009777, Response filed Apr. 28, 2014", w/English Claims, 19 pgs.
"U.S. Appl. No. 13/363,537, Final Office Action mailed Jun. 27, 2014", 8 pgs.
"U.S. Appl. No. 13/742,942, Notice of Allowance mailed Jan. 28, 2014", 8 pgs.
"U.S. Appl. No. 13/755,841, Supplemental Notice of Allowability Jun. 27, 2014", 2 pgs.
"U.S. Appl. No. 13/821,589, Non Final Office Action mailed Jul. 9, 2014", 10 pgs.
"U.S. Appl. No. 13/821,589, Response to Restriction Requirement mailed Apr. 11, 2014", 6 pgs.
"U.S. Appl. No. 13/821,598, Restriction Requirement mailed Aug. 15, 2014", 11 pgs.
"U.S. Appl. No. 13/821,612, Non Final Office Action mailed Jul. 23, 2014", 8 pgs.
"U.S. Appl. No. 13/821,853, Non Final Office Action mailed Jul. 30, 2014", 10 pgs.
"U.S. Appl. No. 13/860,761, Non Final Office Action mailed Aug. 19, 2014", 13 pgs.
"Chinese Application Serial No. 2010800423190, Response filed Aug. 11, 2014 to Office Action mailed Mar. 26, 2014", w/English Claims, 11 pgs.
"Chinese Application Serial No. 201180054796.3, Response filed Jun. 30, 2014 to Office Action mailed Jan. 16, 2014", w/English Claims, 3 pgs.
"Chinese Application Serial No. 201180055029.4, Office Action mailed Jul. 2, 2014", w/English Translation, 5 pgs.
"Chinese Application Serial No. 201180055309.5, Response filed Aug. 13, 2014 to Office Action mailed Mar. 31, 2014", w/English Claims, 27 pgs.
"Chinese Application Serial No. 201380007588.7, Notification to Make Rectification mailed Aug. 18, 2014", 2 pgs.
"Chinese Application Serial No. 201380007615.0, Notification to Make Rectification mailed Aug. 18, 2014", 2 pgs.
"European Application Serial No. 10806751.3, Response filed Jul. 24, 2014 to Office Action mailed Jan. 24, 2014", 26 pgs.
"European Application Serial No. 11826068.6, Extended European Search Report mailed Jul. 16, 2014", 10 pgs.
"European Application Serial No. 13001719.7, Extended European Search Report mailed Jun. 24, 2014", 10 pgs.

"International Application Serial No. PCT/US2013/021411, International Preliminary Report on Patentability mailed Aug. 14, 2014", 7 pgs.
"International Application Serial No. PCT/US2013/023877, International Preliminary Report on Patentability mailed Aug. 14, 2014", 7 pgs.
"International Application Serial No. PCT/US2013/024138, International Preliminary Report on Patentability mailed Aug. 14, 2014", 6 pgs.
"International Application Serial No. PCT/US2013/024149, International Preliminary Report on Patentability mailed Aug. 14, 2014", 6 pgs.
Xia, Guo-Ming, et al., "Phase correction in digital self-oscillation drive circuit for improve silicon MEMS gyroscope bias stability", Solid-State and Integrated Circuit Technology (ICSICT), 2010 10th IEEE International Conference on, IEEE, (Nov. 1, 2010), 1416-1418.
"U.S. Appl. No. 12/849,742, Non Final Office Action mailed Mar. 28, 2013", 9 pgs.
"U.S. Appl. No. 12/849,742, Non Final Office Action mailed Aug. 23, 2012", 9 pgs.
"U.S. Appl. No. 12/849,742, Response filed Jan. 23, 2013 to Non Final Office Action mailed Aug. 23, 2012", 10 pgs.
"U.S. Appl. No. 12/849,742, Response filed Sep. 30, 2013 to Non-Final Office Action mailed Mar. 28, 2013", 12 pgs.
"U.S. Appl. No. 12/849,787, Non Final Office Action mailed May 28, 2013", 18 pgs.
"U.S. Appl. No. 12/849,787, Response filed Feb. 4, 2013 to Restriction Requirement mailed Oct. 4, 2012", 7 pgs.
"U.S. Appl. No. 12/849,787, Response filed Oct. 28, 2013 to Non Final Office Action mailed May 28, 2013", 12 pgs.
"U.S. Appl. No. 12/849,787, Restriction Requirement mailed Oct. 4, 2012", 5 pgs.
"U.S. Appl. No. 12/947,543, Notice of Allowance mailed Dec. 17, 2012", 11 pgs.
"U.S. Appl. No. 13/813,443, Preliminary Amendment mailed Jan. 31, 2013", 3 pgs.
"U.S. Appl. No. 13/821,586, Preliminary Amendment mailed Mar. 8, 2013", 6 pgs.
"U.S. Appl. No. 13/821,589, Preliminary Amendment mailed Mar. 8, 2013", 6 pgs.
"U.S. Appl. No. 13/821,598, Preliminary Amendment mailed Mar. 8, 2013", 7 pgs.
"U.S. Appl. No. 13/821,609, Preliminary Amendment mailed Mar. 8, 2013", 3 pgs.
"U.S. Appl. No. 13/821,612, Preliminary Amendment mailed Mar. 8, 2013", 3 pgs.
"U.S. Appl. No. 13/821,619, Preliminary Amendment mailed Mar. 8, 2013", 3 pgs.
"U.S. Appl. No. 13/821,793, Preliminary Amendment mailed Mar. 8, 2013", 3 pgs.
"U.S. Appl. No. 13/821,842, Preliminary Amendment mailed Mar. 8, 2013", 3 pgs.
"U.S. Appl. No. 13/821,853, Preliminary Amendment mailed Mar. 8, 2013", 3 pgs.
"Application Serial No. PCT/US2011/051994, International Republished Application mailed Jun. 7, 2012", 1 pg.
"Application Serial No. PCT/US2011/052006, International Republished Application mailed Jun. 7, 2012", 1 pg.
"Application Serial No. PCT/US2011/052417, International Republished Application mailed Jun. 7, 2012", 1 pg.
"Chinese Application Serial No. 201180053926.1, Amendment filed Aug. 21, 2013", w/English Translation, 13 pgs.
"Chinese Application Serial No. 201180055309.5, Voluntary Amendment filed Aug. 23, 2013", w/English Translation, 13 pgs.
"Chinese Application Serial No. 201320165465.3, Office Action mailed Jul. 22, 2013", w/English Translation, 2 pgs.
"Chinese Application Serial No. 201320165465.3, Response filed Aug. 7, 2013 to Office Action mailed Jul. 22, 2013", w/English Translation, 39 pgs.
"Chinese Application Serial No. 201320171504.0, Office Action mailed Jul. 22, 2013", w/English Translation, 3 pgs.

(56) References Cited

OTHER PUBLICATIONS

"Chinese Application Serial No. 201320171504.0, Response filed Jul. 25, 2013 to Office Action mailed Jul. 22, 2013", w/English Translation, 33 pgs.
"Chinese Application Serial No. 201320171616.6, Office Action mailed Jul. 10, 2013", w/English Translation, 2 pgs.
"Chinese Application Serial No. 201320171757.8, Office Action mailed Jul. 11, 2013", w/English Translation, 2 pgs.
"Chinese Application Serial No. 201320171757.8, Response filed Jul. 25, 2013 to Office Action mailed Jul. 11, 2013", w/English Translation, 21 pgs.
"Chinese Application Serial No. 201320171757.8, Response filed Jul. 26, 2013 to Office Action mailed Jul. 10, 2013", w/English Translation, 40 pgs.
"Chinese Application Serial No. 201320172128.7, Office Action mailed Jul. 12, 2013", w/English Translation, 3 pgs.
"Chinese Application Serial No. 201320172128.7, Response filed Aug. 7, 2013 to Office Action mailed Jul. 12, 2013", w/English Translation, 39 pgs.
"Chinese Application Serial No. 201320172366.8, Office Action mailed Jul. 9, 2013", w/English Translation, 3 pgs.
"Chinese Application Serial No. 201320172366.8, Response filed Sep. 16, 2013 to Office Action mailed Jul. 9, 2013", w/English Translation, 24 pgs.
"Chinese Application Serial No. 201320172367.2, Office Action mailed Jul. 9, 2013", w/English Translation, 2 pgs.
"Chinese Application Serial No. 201320172367.2, Response filed Sep. 16, 2013 to Office Action mailed Jul. 9, 2013", w/English Translation, 24 pgs.
"Chinese Application Serial No. 201320185461.1, Office Action mailed Jul. 23, 2013", w/English Translation, 3 pgs.
"Chinese Application Serial No. 201320185461.1, Response filed Sep. 10, 2013 to Office Action mailed Jul. 23, 2013", w/English Translation, 25 pgs.
"Chinese Application Serial No. 201320186292.3, Office Action mailed Jul. 19, 2013", w/English Translation, 2 pgs.
"Chinese Application Serial No. 201320186292.3, Response filed Sep. 10, 2013 to Office Action mailed Jul. 19, 2013", w/English Translation, 23 pgs.
"DigiSiMic™ Digital Silicon Microphone Pulse Part Number: TC100E", TC100E Datasheet version 4.2 DigiSiMic™ Digital Silicon Microphone. (Jan. 2009), 6 pgs.
"EPCOS MEMS Microphone With TSV", (2005), 1 pg.
"European Application Serial No. 13001692.6, European Search Report mailed Jul. 24, 2013", 5 pgs.
"European Application Serial No. 13001696.7, Extended European Search Report mailed Aug. 6, 2013", 4 pgs.
"European Application Serial No. 13001721.3, European Search Report mailed Jul. 18, 2013", 9 pgs.
"International Application Serial No. PCT/US2010/002166, International Preliminary Report on Patentability mailed Feb. 16, 2012", 6 pgs.
"International Application Serial No. PCT/US2010/002166, International Search Report mailed Feb. 28, 11", 3 pgs.
"International Application Serial No. PCT/US2010/002166, Written Opinion mailed Feb. 28, 2011", 4 pgs.
"International Application Serial No. PCT/US2011/051994, International Preliminary Report on Patentability mailed Mar. 28, 2013", 8 pgs.
"International Application Serial No. PCT/US2011/051994, International Search Report mailed Apr. 16, 2012", 3 pgs.
"International Application Serial No. PCT/US2011/051994, Written Opinion mailed Apr. 16, 2012", 6 pgs.
"International Application Serial No. PCT/US2011/052006, International Preliminary Report on Patentability mailed Mar. 28, 2013", 7 pgs.
"International Application Serial No. PCT/US2011/052006, Search Report mailed Apr. 16, 2012", 3 pgs.
"International Application Serial No. PCT/US2011/052006, Written Opinion mailed Apr. 16, 2012", 5 pgs.
"International Application Serial No. PCT/US2011/052059, International Preliminary Report on Patentability mailed Jan. 22, 2013", 14 pgs.
"International Application Serial No. PCT/US2011/052059, Search Report mailed Apr. 20, 2012", 4 pgs.
"International Application Serial No. PCT/US2011/052059, Written Opinion mailed Apr. 20, 2012", 7 pgs.
"International Application Serial No. PCT/US2011/052060, International Preliminary Report on Patentability mailed Jan. 22, 2013", 12 pgs.
"International Application Serial No. PCT/US2011/052060, International Search Report Apr. 20, 2012", 3 pgs.
"International Application Serial No. PCT/US2011/052060, Written Opinion mailed Apr. 20, 2012", 7 pgs.
"International Application Serial No. PCT/US2011/052061, International Preliminary Report on Patentability mailed Mar. 28, 2013", 6 pgs.
"International Application Serial No. PCT/US2011/052061, International Search Report mailed Apr. 10, 2012", 3 pgs.
"International Application Serial No. PCT/US2011/052061, Written Opinion mailed Apr. 10, 2012", 4 pgs.
"International Application Serial No. PCT/US2011/052064, International Preliminary Report on Patentability mailed Mar. 28, 2013", 5 pgs.
"International Application Serial No. PCT/US2011/052064, Search Report mailed Feb. 29, 2012", 3 pgs.
"International Application Serial No. PCT/US2011/052064, Written Opinion mailed Feb. 29, 2012", 3 pgs.
"International Application Serial No. PCT/US2011/052065, International Preliminary Report on Patentability mailed Mar. 28, 2013", 7 pgs.
"International Application Serial No. PCT/US2011/052065, International Search Report mailed Apr. 10, 2012", 3 pgs.
"International Application Serial No. PCT/US2011/052065, Written Opinion mailed Apr. 10, 2012", 5 pgs.
"International Application Serial No. PCT/US2011/052340, International Preliminary Report on Patentability mailed Apr. 4, 2013", 5 pgs.
"International Application Serial No. PCT/US2011/052340, Search Report mailed Feb. 29, 2012", 3 pgs.
"International Application Serial No. PCT/US2011/052340, Written Opinion mailed Feb. 29, 2012", 3 pgs.
"International Application Serial No. PCT/US2011/052369, International Preliminary Report on Patentability mailed Apr. 4, 2013", 5 pgs.
"International Application Serial No. PCT/US2011/052369, International Search Report mailed Apr. 24, 2012", 6 pgs.
"International Application Serial No. PCT/US2011/052369, Written Opinion mailed Apr. 24, 2012", 3 pgs.
"International Application Serial No. PCT/US2011/052417, International Preliminary Report on Patentability mailed Apr. 4, 2013", 6 pgs.
"International Application Serial No. PCT/US2011/052417, International Search Report mailed Apr. 23, 2012", 5 pgs.
"International Application Serial No. PCT/US2011/052417, Written Opinion mailed Apr. 23, 2012", 4 pgs.
"International Application Serial No. PCT/US2013/021411, International Search Report mailed Apr. 30, 2013", 5 pgs.
"International Application Serial No. PCT/US2013/021411, Written Opinion mailed Apr. 30, 2013", 5 pgs.
"International Application Serial No. PCT/US2013/023877, International Search Report mailed May 14, 2013", 3 pgs.
"International Application Serial No. PCT/US2013/023877, Written Opinion mailed May 14, 2013", 5 pgs.
"International Application Serial No. PCT/US2013/024138, International Search Report mailed May 24, 2013", 3 pgs.
"International Application Serial No. PCT/US2013/024138, Written Opinion mailed May 24, 2013", 4 pgs.
"International Application Serial No. PCT/US2013/024149, Written Opinion mailed", 4 pages.
"International Application Serial No. PCT/US2013/024149, International Search Report mailed", 7 pages.

(56) References Cited

OTHER PUBLICATIONS

"Korean Application Serial No. 10-2013-7009775, Office Action mailed Sep. 17, 2013", w/English Translation, 6 pgs.
"Korean Application Serial No. 10-2013-7009777, Office Action mailed Sep. 17, 2013", w/English Translation, 8 pgs.
"Korean Application Serial No. 10-2013-7009788, Office Action mailed Aug. 29, 2013", w/English Translation, 6 pgs.
"Korean Application Serial No. 10-2013-7009790, Office Action mailed Jun. 26, 2013", W/English Translation, 7 pgs.
"Korean Application Serial No. 10-2013-7009790, Response filed Aug. 26, 2013 to Office Action mailed Jun. 26, 2013", w/English Claims, 11 pgs.
"Korean Application Serial No. 10-2013-7010143, Office Action mailed May 28, 2013", w/English Translation, 5 pgs.
"Korean Application Serial No. 10-2013-7010143, Response filed Jul. 24, 2013 to Office Action mailed May 28, 2013", w/English Claims, 14 pgs.
"T4020 & T4030 MEMS Microphones for Consumer Electronics", Product Brief 2010, Edition Feb. 2010, (2010), 2 pgs.
Acar, Cenk, et al., "Chapter 4: Mechanical Design of MEMS Gyroscopes", MEMS Vibratory Gyroscopes: Structural Approaches to Improve Robustness, Springer, (2009), 73-110.
Acar, Cenk, et al., "Chapter 6: Linear Multi DOF Architecture—Sections 6.4 and 6.5", MEMS Vibratory Gyroscopes: Structural Approaches to Improve Robustness, Springer, (2009), 158-178.
Acar, Cenk, et al., "Chapter 7: Torsional Multi-DOF Architecture", MEMS Vibratory Gyroscopes: Structural Approaches to Improve Robustness, Springer, (209), 187-206.
Acar, Cenk, et al., "Chapter 8: Distributed-Mass Architecture", MEMS Vibratory Gyroscopes: Structural Approaches to Improve Robustness, Springer, (2009), 207-224.
Acar, Cenk, et al., "Chapter 9: Conclusions and Future Trends", MEMS Vibratory Gyroscopes: Structural Approaches to Improve Robustness, Springer, (2009), 225-245.
Beyne, E, et al., "Through-silicon via and die stacking technologies for microsystems-integration", IEEE International Electron Devices Meeting, 2008. IEDM 2008., (Dec. 2008), 1-4.
Cabruja, Enric, et al., "Piezoresistive Accelerometers for MCM-Package-Part II", The Packaging Journal of Microelectromechanical Systems. vol. 14, No. 4, (Aug. 2005), 806-811.
Ezekwe, Chinwuba David, "Readout Techniques for High-Q Micromachined Vibratory Rate Gyroscopes", Electrical Engineering and Computer Sciences University of California at Berkeley, Technical Report No. UCB/EECS-2007-176, http://www.eecs.berkeley.edu/Pubs/TechRpts/2007/EECS-2007-176.html, (Dec. 21, 2007), 94 pgs.
Ferreira, Antoine, et al., "A Survey of Modeling and Control Techniques for Micro- and Nanoelectromechanical Systems", IEEE Transactions on Systems, Man and Cybernetics—Part C: Applications and Reviews vol. 41, No. 3., (May 2011), 350-364.
Fleischer, Paul E, "Sensitivity Minimization in a Single Amplifier Biquad Circuit", IEEE Transactions on Circuits and Systems. vol. Cas-23, No. 1, (1976), 45-55.
Krishnamurthy, Rajesh, et al., "Drilling and Filling, but not in your Dentist's Chair A look at some recent history of multi-chip and through silicon via (TSV) technology", Chip Design Magazine, (Oct./Nov. 2008), 7 pgs.
Reljin, Branimir D, "Properties of SAB filters with the two-pole single-zero compensated operational amplifier", Circuit Theory and Applications: Letters to the Editor. vol. 10, (1982), 277-297.
Rimskog, Magnus, "Through Wafer Via Technology for MEMS and 3D Integration", 32nd IEEE/CPMT International Electronic Manufacturing Technology Symposium, 2007. IEMT '07., (2007), 286-289.
Sedra, Adel, et al., "Chapter 8.9: Effect of Feedback on the Amplifier Poles", Microelectronic Circuits, 5th edition, (2004), 836-864.
Song-Hee, Cindy Paik, "A MEMS-Based Precision Operational Amplifier", Submitted to the Department of Electrical Engineering and Computer Sciences MIT, [Online]. Retrieved from the Internet: <URL: http://dspace.mit.edu/bitstream/handle/1721.1/16682/57138272.pdf? . . . >, (Jan. 1, 2004), 123 pgs.
"U.S. Appl. No. 13/821,598, Non Final Office Action mailed Jul. 7, 2015", 9 pgs.
"U.S. Appl. No. 13/821,598, Response filed Oct. 7, 2015 to Non Final Office Action mailed Jul. 7, 2015", 10 pgs.
"U.S. Appl. No. 13/821,793, Non Final Office Action mailed Jul. 27, 2015", 14 pgs.
"U.S. Appl. No. 13/821,793, Response filed Oct. 27, 2015 to Non Final Office Action mailed Jul. 27, 2015", 12 pgs.
"Chinese Application Serial No. 201180055630.3, Office Action mailed Jul. 10, 2015", w/ English Claims, 8 pgs.
"Chinese Application Serial No. 201180055630.3, Response filed Sep. 25, 2015 to Office Action mailed Jul. 10, 2015", w/ English Claims, 14 pgs.
"Chinese Application Serial No. 201180055823.9,Response filed Aug. 3, 2015 to Office Action mailed Mar. 19, 2015", w/ English Translation, 14 pgs.
"Chinese Application Serial No. 201310415336.X, Office Action mailed Jul. 3, 2015", w/ English Claims, 9 pgs.
"European Application Serial No. 11826069.4, Extended European Search Report mailed Jul. 23, 2015", 8 pgs.
"European Application Serial No. 11827357.2, Extended European Search Report mailed Aug. 26, 2015", 4 pgs.

* cited by examiner

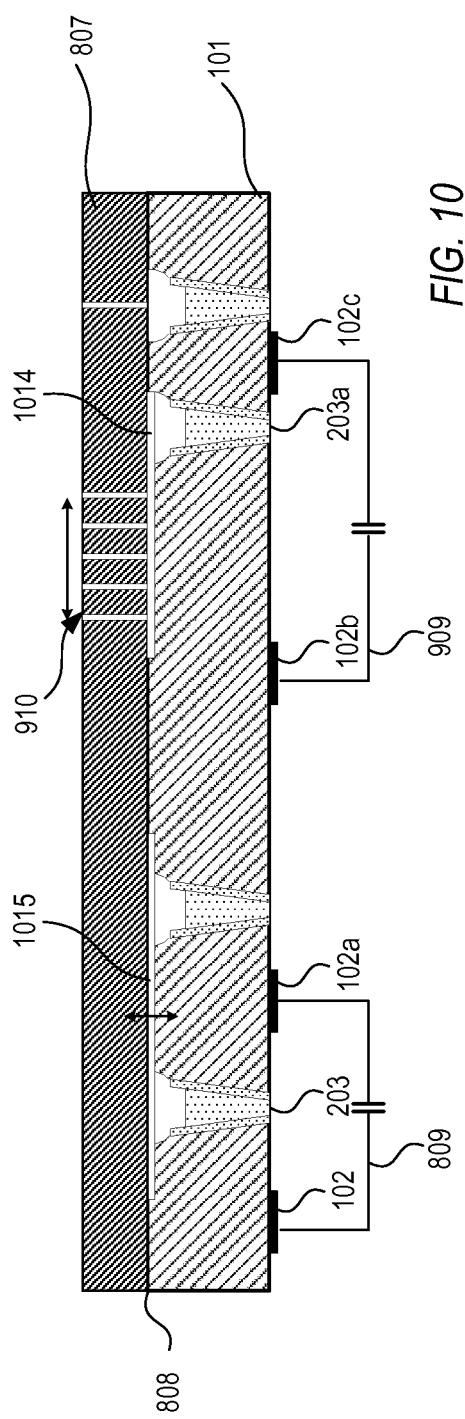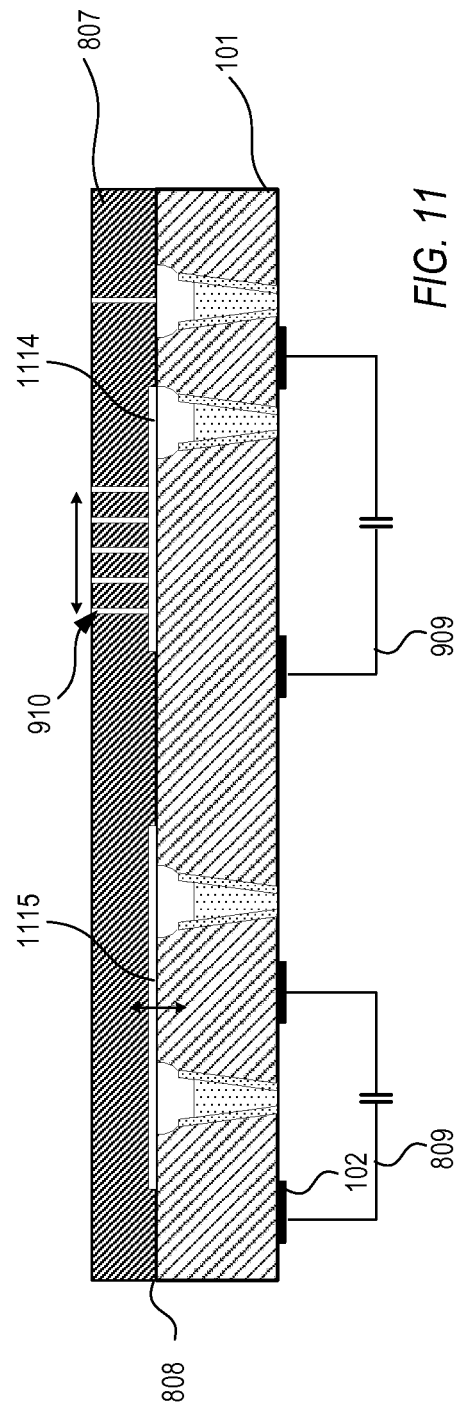

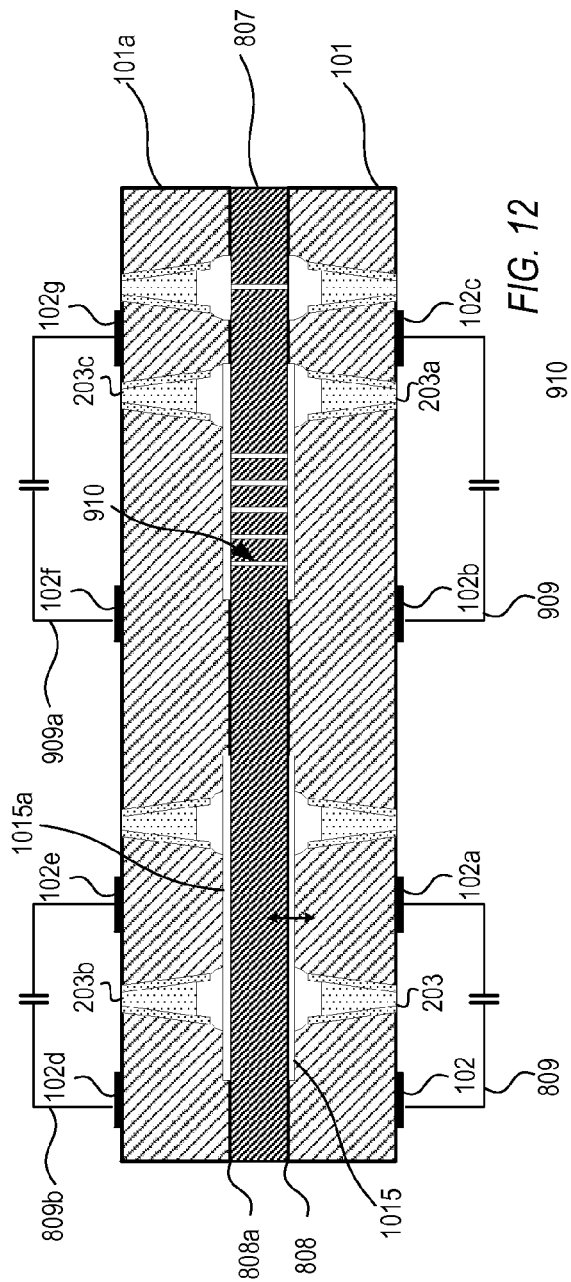
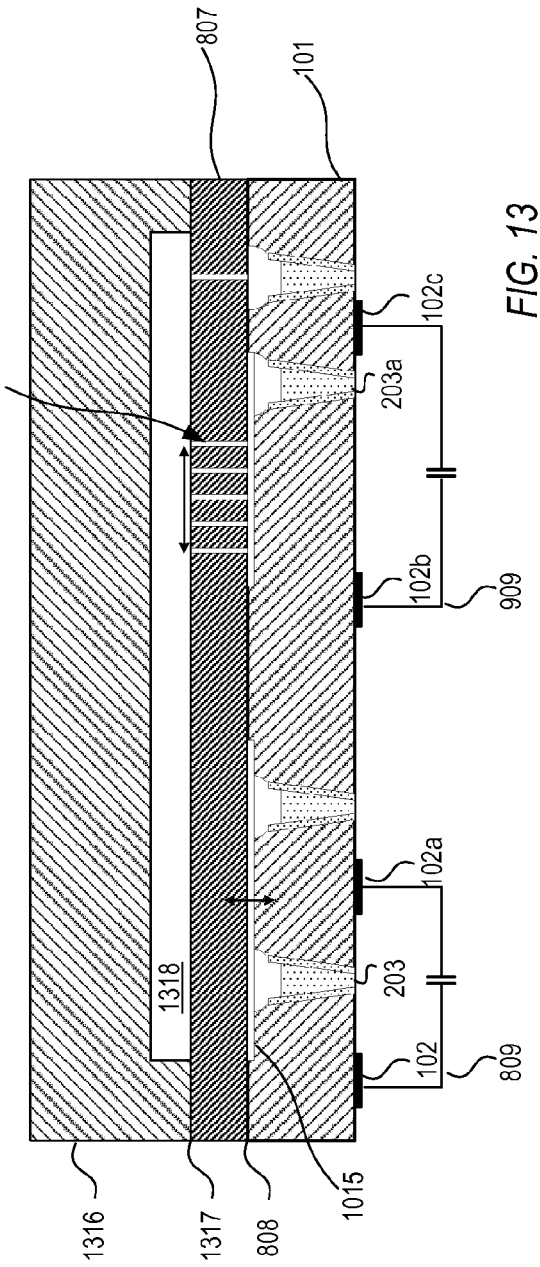

US 9,425,328 B2

THROUGH SILICON VIA INCLUDING MULTI-MATERIAL FILL

CLAIM OF PRIORITY

This application claims the benefit of priority under 35 U.S.C. §119(e) of David L. Marx et al. U.S. Provisional Patent Application Ser. No. 61/700,186, entitled "IMPROVED THROUGH-SILICON VIA INCLUDING MULTI-MATERIAL FILL," filed on Sep. 12, 2012, which is incorporated by reference herein in its entirety.

BACKGROUND

Small semiconductor-scale devices such as capacitors are widely used in electronics such as personal electronics. These devices may be used as pressure transducers. For example, the devices can be used as microphones, such as for recording or playing sound. They may be used as motion detectors, functioning as accelerometers and/or gyroscopes. Other uses are possible. As market demand for personal electronics grows, manufacturers seek to benefit from devices of reduced size and decreased cost so that they may create improved personal electronics.

U.S. Pat. No. 7,539,003 provides capacitive sensors with single crystal silicon on all key stress points. Isolating trenches are formed by trench and refill forming dielectrically isolated conductive silicon electrodes for drive, sense and guards, as illustrated in FIG. 1A. The pressure port is opposed to the electrical wire bond pads for ease of packaging. Dual-axis accelerometers measuring in-plane acceleration and out-of-plane acceleration are also described. A third axis in plane is provided by duplicating and rotating the accelerometer 90 degrees about its out-of-plane axis.

As illustrated in FIG. 1A, one of the approaches in U.S. Pat. No. 7,539,003 relies on devices formed using an undesirable single-material dielectric trench 100 configuration. The trench passes through a semiconductor 101 and has two contacts 102. It is difficult to manufacture, at least because it is difficult to deposit fill as shown.

OVERVIEW

This document discusses, among other things, an apparatus including a substrate having at least one via disposed in the substrate, wherein the substrate includes a trench having a substantially trapezoidal cross-section, the trench extending through the substrate between a lower surface of the substrate and an upper surface of the substrate, wherein the top of the trench opens to a top opening, and the bottom of the trench opens to a bottom opening, the top opening being larger than the bottom opening. The apparatus can include a mouth surrounding the top opening and extending between the upper surface and the top opening, wherein a mouth opening in the upper surface is larger than the top opening of the trench, wherein the via includes a dielectric layer disposed on an inside surface of a trench. The apparatus includes and a fill disposed in the trench, with the dielectric layer sandwiched between the fill and the substrate.

This section is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

FIG. 10 illustrates a cross-section side-view of a device with a pressure transducer and motion sensor(s) (gyroscope, accelerometer, magnetometer, etc.) or microphone, according to an example.

FIG. 11 illustrates a cross-section side-view of a device with a cavity disposed in the device layer, according to an example.

FIG. 12 illustrates a cross-section side-view of a device with multiple via substrates, according to an example.

FIG. 13 illustrates a cross-section side-view of a device with a cap over the device layer, according to an example.

DETAILED DESCRIPTION

Figure 1A:
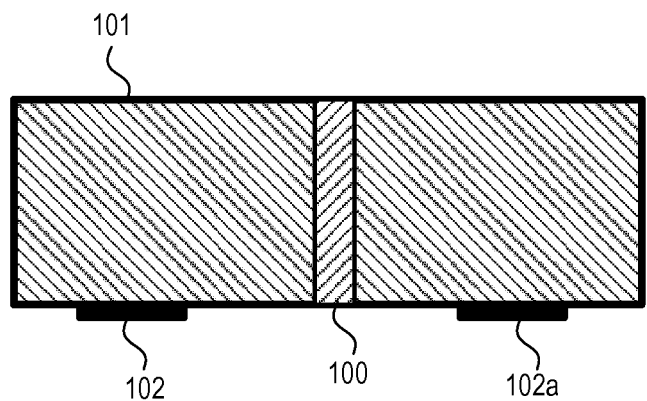
FIG. 1A illustrates a cross-section side-view of a device with a single material trench, according to the prior art.
Figure 1B:
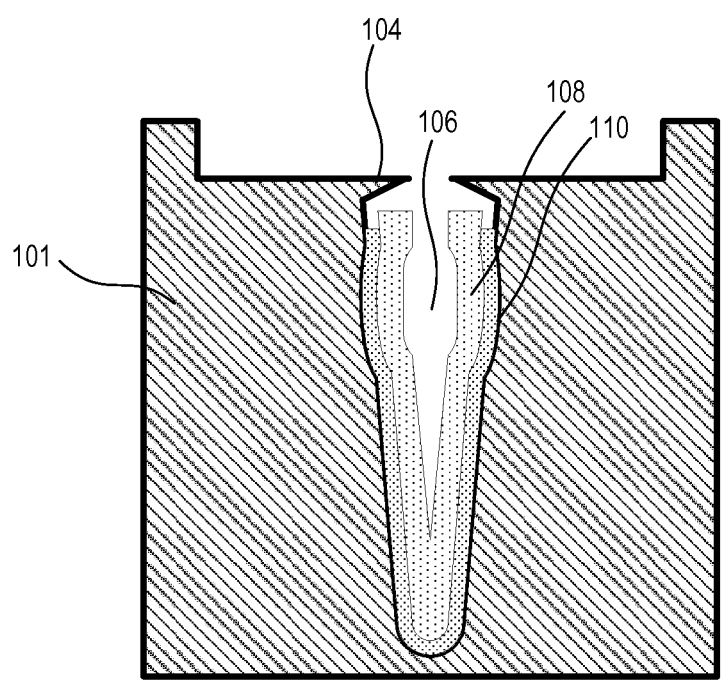
FIG. 1B illustrates a cross-section side-view of a device with overhangs and a void, according to an example.

The present subject matter addresses shortcomings of the prior art. An approach as outlined in U.S. Pat. No. 7,539,003 can result in structure illustrated in FIG. 1B. The illustration shows undesirable overhangs 104 and undesirable voids 106, as produced by the process discussed beginning in column four of U.S. Pat. No. 7,539,003. According to the approach, achieving a desirable thickness, e.g., 150 μm, of a through-silicon-via (TSV) wafer using deep reactive ion etching (DRIE) of a desirable aspect ratio, for example 30:1, that includes a material 108 such as a conductive material disposed inside a dielectric material 110 such as an oxide can result in an undesirably thick, e.g., 5 μm thick, dielectric trench that is difficult to fill without forming voids 106.

A typical dielectric trench can include silicon dioxide, and formation of such a thick oxide in such a deep trench can be difficult at least because it encourages the formation of voids 106 that can decrease the likelihood of forming a hermetic seal from the top of the device to the bottom of the device. Such an approach also can create significant stress in the silicon substrate which can affect device integrity, especially in devices having a large density of such deep vias, making wafers prone to cracking. The overhangs 104 contribute to the formation of voids, at least by discouraging a desired level of filling of the cavity in the semiconductor 101.

The present subject matter provides, among other things, through-silicon vias that can survive high temperature wafer bonding, including fusion bonding performed at over 1000 degrees Celsius, with improved manufacturability over prior art. The present subject matter reduces the influence of the above mentioned approaches in some instances by replacing a single material trench with a two-material trench, wherein the second material has a better filling ability and can form vias with fewer or no voids, which can improve sealing, such as hermetic sealing. Certain examples provide an improved trench to enable easier fill of the trench without voids (i.e., one or more voids). Examples provide improved matching of thermal coefficient of expansion (TCE) to monocrystalline silicon than a single material approach. Such an approach can reduce instances of wafer bow and thus improving wafer integrity.

Figure 2:
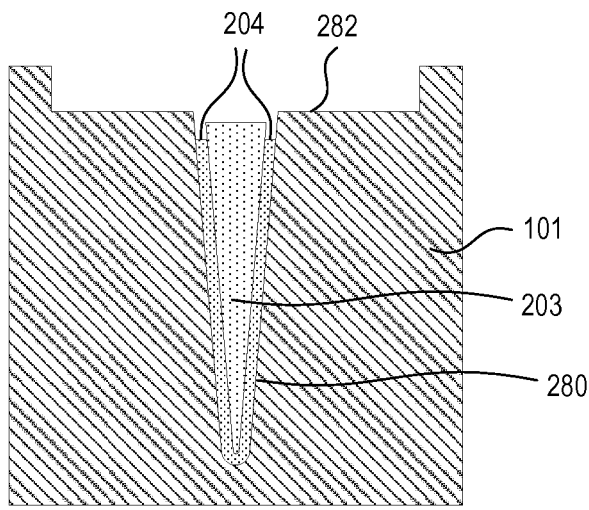
FIG. 2 illustrates a cross-section side-view of a via with desirable attributes, according to an example.

FIG. 2 illustrates a cross-section side-view of a via with desirable attributes, according to an example. In the example, a semiconductor 101, such as a silicon semiconductor, such as a single crystal silicon (SCS) semiconductor, has a via such as a through-silicon via formed therein. In substrate 101 can have a trench 280 disposed partially or entirely therethrough. Fill 203 and dielectric 204 can be sealed to the substrate hermetically. The fill 203 can be recessed below an upper surface 282 of the silicon. A recessed dielectric can reduce instances of contact between the dielectric and a component that may be disposed adjacent the upper surface 282. The combination of the dielectric 204 and the fill 203 can provide for stresses, resulting from formation, that counteract one another to reduce deformation of the substrate 101.

Figure 3:
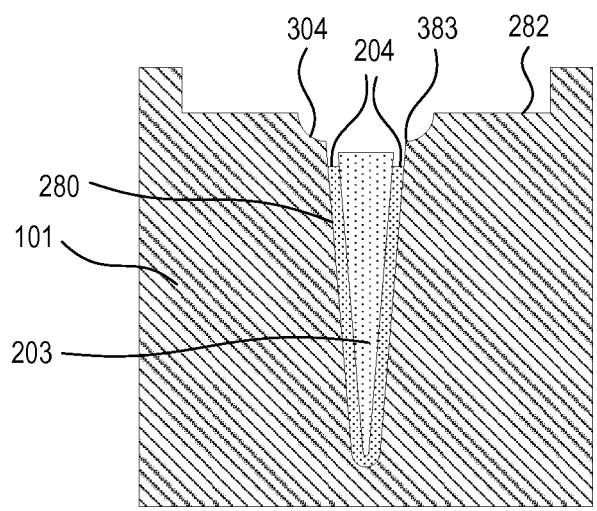
FIG. 3 illustrates a cross-section side-view of a via with a curvilinear flute, according to an example.

FIG. 3 illustrates a cross-section side-view of a via with a curvilinear flute, according to an example. In the example, a flute or mouth 304 can surround a top opening 383 and can extend from an upper surface 282 and a top opening into the substrate. The mouth can form a part of a monotonically decreasing via cross-sectional width. The mouth 304 can be larger than the top opening 383 of the trench. A mouth etch can be substantially isotropic, or highly tapered (e.g., a highly tapered DRIE). Forming the mouth can include at least one of plasma etching, xenon diflouride etching or wet etching the mouth. The mouth can enable one to undercut masking material disposed on the upper surface 282, which can remove overhangs or overhangs 104. Additionally, the mouth 304 can reduces or eliminate blowout deeper in the trench 280.

The via can be substantially void free, meaning that the fill 203 conforms to the dielectric 204 and extends out of a cavity defined by the dielectric 204 in a monolithic piece.

The fill 203 can include at least one of polysilicon or a combination of semiconductor and dielectric. Polysilicon can include undoped super-conformal fine grain polysilicon. Fill 203 can include thermal oxide. Fill 203 can include at least one of tetraethylorthosilicate (TEOS) or another low temperature oxide.

The aspect ratio of height to width can range from 15:1 to 50:1. Depth can range from 0 μm to one or more millimeters. One example defines an aspect ratio of around 30:1 with a depth of between 10 and 200 μm. Compensate the stresses between the materials to result in near zero bow. In some examples, polysilicon is used for fill 203, disposed inside an oxide grown on the silicon. A via that is 175 μm deep via can be formed, and can include a 2 μm thermal oxide and around an 8 μm polysilicon width at the top of the via, with a 2 μm oxide and 4 μm poly-Si width at the bottom.

Figure 4:
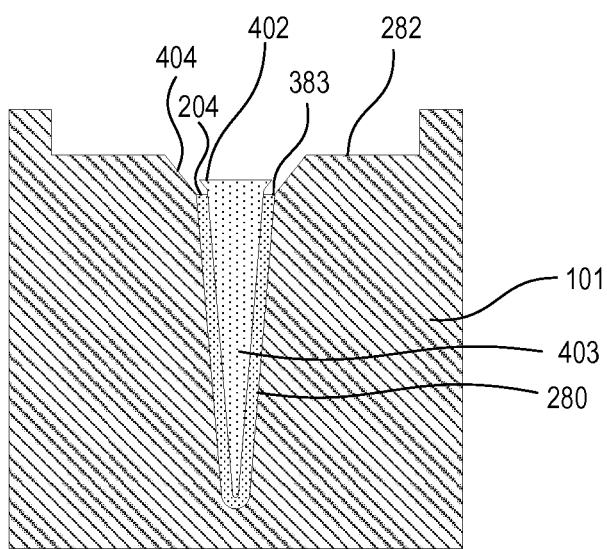
FIG. 4 illustrates a cross-section side-view of a via with substantially linear flute, according to an example.

FIG. 4 illustrates a cross-section side-view of a via with substantially linear mouth, according to an example. In the example, a linear mouth 404 opens to the upper surface 282 and is sized to be larger than a top opening 383 of the trench 280. Small cantilevered overhangs 402 may be formed at the top of the fill 403. This can be a byproduct of an etching process by which dielectric and/or fill are removed to recess the dielectric below the surface 282, as discussed herein, such as in relation to FIG. 17. Although the mouths illustrated in FIGS. 4 and 5 form a taper of a different slope than the remainder of the trench 280, examples can include a smooth transition between the portion of the via that is filled and the remaining portions, as illustrated in FIG. 2. Other configurations are possible such that the mouth is wider than the trench and the overhangs are eliminated.

Figure 5:
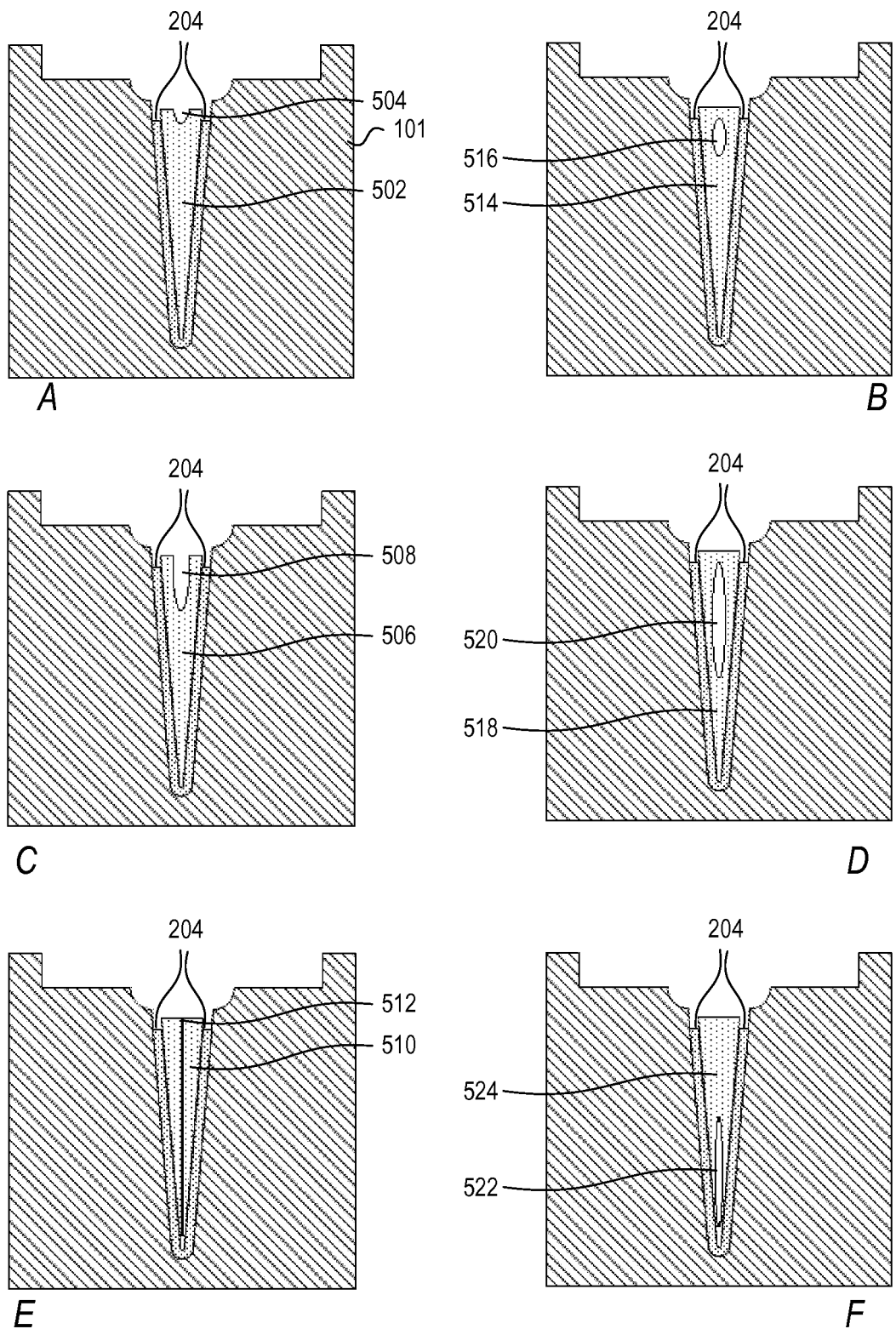
FIG. 5 illustrates several different views of voids, according to various examples.

FIG. 5 illustrates different views of voids, according to various examples. Seams or voids can undesirably reduce the ability of a device to be sealed hermetically. Further, seams or voids can reduce mechanical stability of a device, such as by concentrating bending stresses applied to the device at one place such as the seam. Additionally, seams or voids can create processing difficulties, such as by creating stores in which materials intended to be removed become lodged. These stored materials can then be released during a later process step or in application, and can have undesirably effects on the performance of the device.

Examples disclosed in A and B illustrate a void that is small enough to allow for adequate sealing and structural integrity, including rigidity. In view A the void 504 can collect material, which is undesirable. If the void 504 can be reduced to a small seam that runs less than the length of the fill 502, desirable performance can be achieved.

In view B, the void 516 in 514 can reduce structural integrity. For example, the fill can break open. Such a result could adversely affect device performance. However, if the void 516 is maintained below a size that can cause breakage at a specified stress, desirable performance can be achieved. A void that is less than 20% of the depth of the fill 514, and that is self-contained such that it is not open to surface or bottom, can provide acceptable performance. However, such a void can lead to manufacturing problems related to the difficulty in controlling the size of the void.

In view C, a large, open seam 508 disposed in fill 506 is pictured. The seam can trap processing materials (e.g., photoresist). Such a seam can impact hermeticity and ability to process wafers at volume. One or more cleaning processes can be used to extract such materials, resulting in desirable devices.

In view D, a large, self-contained void or seam 520 in fill 518 is pictured that can cause mechanical instability and reduce hermeticity. Again, controlling he size of the void or seam is difficult.

In view E, a thin seam 512 in fill 510 spans a length such as the entire length of the via. Such a seam can provide a path for leakage from the top of the via to the bottom of the via, which can negatively impact hermeticity and mechanical stability, such as by providing a stress riser in the device. In some instances, a via can fall out of a substrate.

In view F, a void 522 is disposed lower in the fill 524. Large seams near the bottom of a via can lead to device malfunction if a via reveal process is used. The seams can be opened during via reveal, making processing difficult and encouraging contamination. If a via reveal process is not used, a device with acceptable performance can result, however precise control can be difficult.

Figure 6:
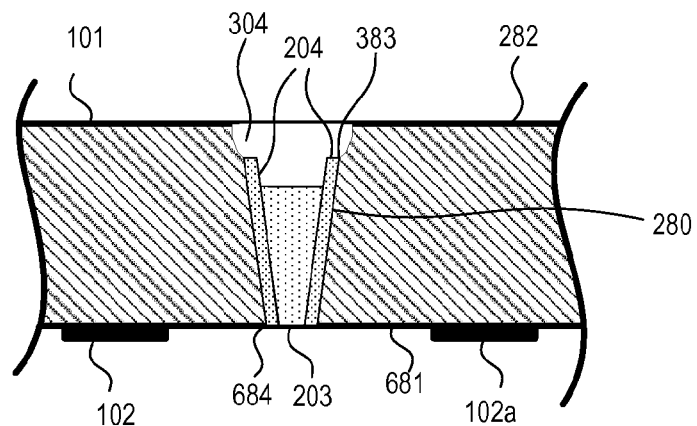
FIG. 6 illustrates a cross-section side-view of a device with a multi-material trench, according to an example.

FIG. 6 illustrates a cross-section side-view of a device with a multi-material trench, according to an example. The device is useful to avoid void formation during formation of multi-material vias through silicon. The trench 280 can define a substantially trapezoidal cross-section as illustrated. The trench 280 can extend through the substrate 101 between a lower surface 681 of the substrate 280 and an upper surface 282 of the substrate. A top of the trench 280 can open to a top opening 383. A bottom of the trench 280 can open to a bottom opening 684. The top opening 383 can be larger in area than the bottom opening 684. One or both of the top opening and the bottom opening can be less than 30 µm across, and distance between them can be from 5 µm to 500 µm. Such sizing can improve the ability to dispose the fill 203 in the dielectric 204 without voids.

A dielectric 204, such as a layer, can be disposed on an inside surface of a trench 280. A fill 203 can be disposed in the trench, with the dielectric layer sandwiched between the fill and the substrate. The configuration can provide a hermetic seal. The seal can resist leakage with a minimum pressure differential of one atmosphere between the upper surface of the substrate and the lower surface of the substrate. Such a seal can provide a via compatible with forming a boundary to a cavity that is sealed under vacuum with respect to an ambient of the apparatus.

Figure 7A:
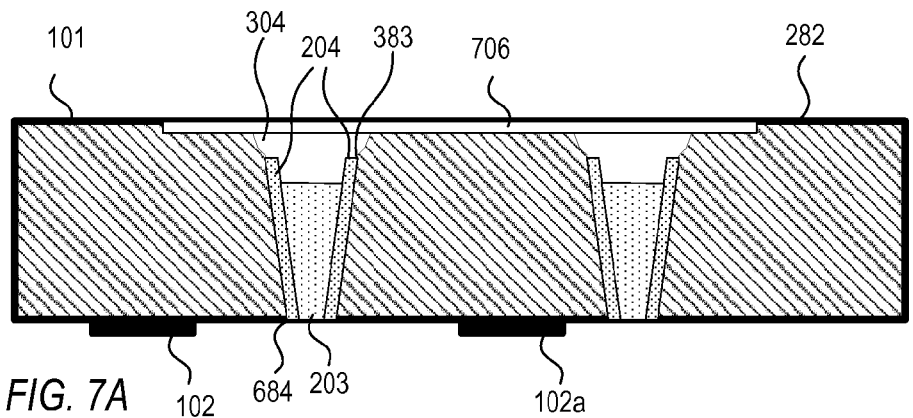
FIG. 7A illustrates a cross-section side-view of a device with a multi-material trench defining a perimeter, according to an example. The perimeter is pictured in FIG. 7B, which is a sectional taken along line 7A-7A.
Figure 7B:
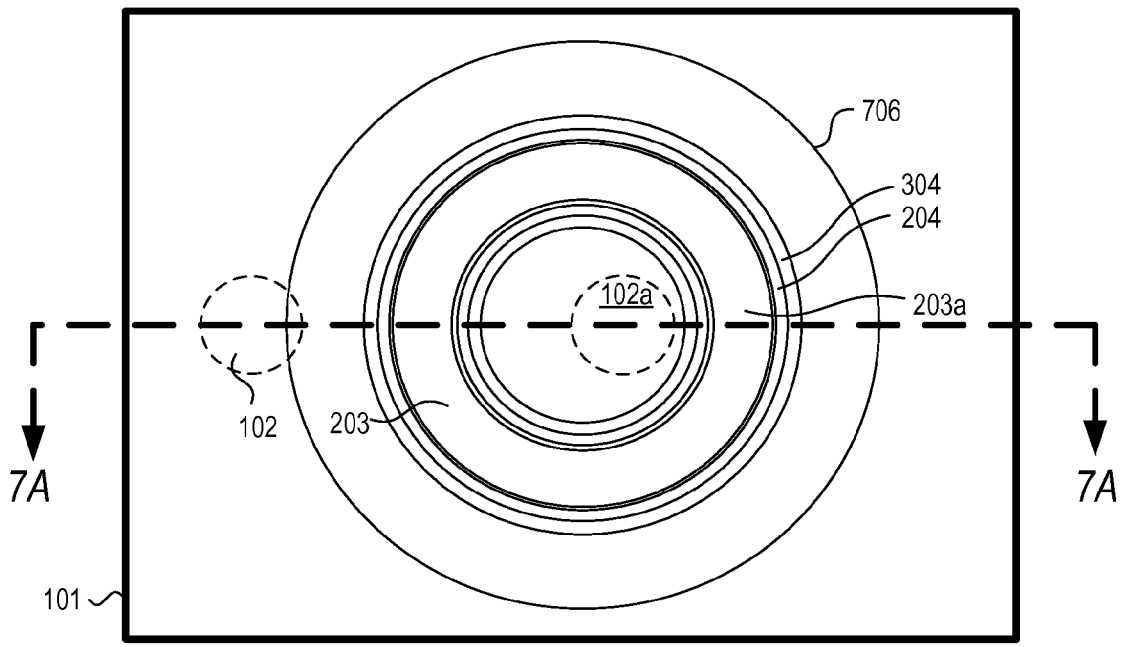

FIG. 7A illustrates a cross-section side-view of a device with a multi-material trench defining a perimeter, according to an example. The perimeter is pictured in FIG. 7B, which is a sectional taken along line 7A-7A. A trench can be a trench defining a circuit. The trench can define a circuit in the substrate 101, with an inner portion of the substrate being in the circuit, and an outer portion surrounding the circuit. The inner portion can be dielectrically isolated from the outer portion. The trench can taper narrower in cross-section from the top opening 383 to the bottom opening 684.

A cavity 706 can be disposed in the silicon 101. The cavity can be between 0.001 µm and 1000 µm in depth. A top aperture and the mouth can be disposed within the cavity. The cavity edge to via spacing can be greater than or equal to 5 µm.

Figure 8A:
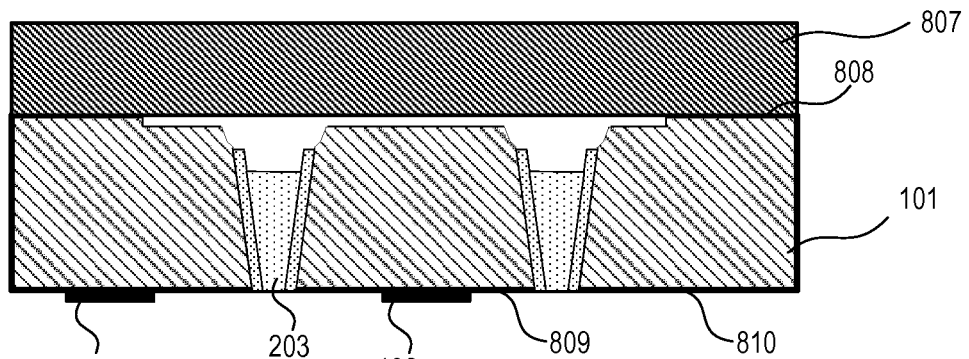
FIG. 8A illustrates a cross-section side-view of a device with a multi-material trench defining a perimeter covered by a device layer, according to an example.
Figure 8B:
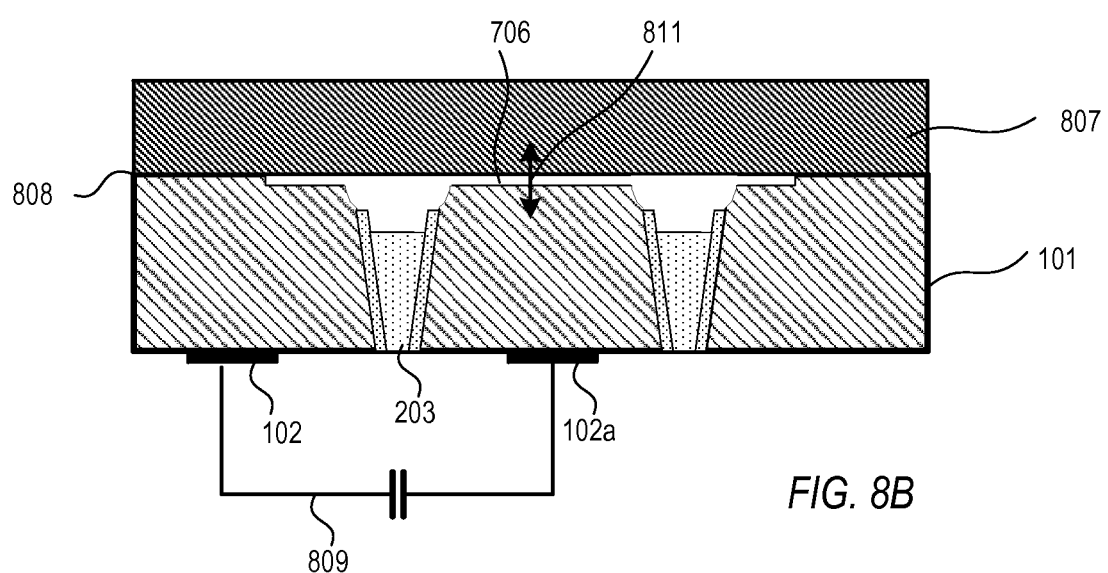
FIG. 8B illustrates a cross-section side-view of a device with a multi-material trench defining a perimeter covered by a device layer, showing a capacitive effect, according to an example.

FIGS. 8A-B show a cross-section side-view of a device with a multi-material trench defining a perimeter covered by a device layer, according to an example. A cap or second substrate 807 can be bonded to the first substrate 101. The second substrate 807 can be formed of single crystal silicon. The bond can include a fusion bond. The fusion bond can include at least one of a hydrophobic bond and a hydrophilic bond. The bond can include a eutectic bond, adhesive bond, or anodic bond. The second substrate can be between 2 µm and 1000 µm in thickness. The second substrate can be between 2 µm and 1000 µm in thickness.

The trench of fill 203 defines a circuit in the substrate 101, with an inner portion 809 of the substrate being in the circuit, and an outer portion 810 surrounding the circuit. With the second substrate 807 bonded to the first substrate with a hermetic seal, and the each of the vias including fill 203 sealed to the first substrate 101, the cavity 706 can be sealed, such as hermetically sealed, from an ambient atmosphere of the device.

Covering all or a portion of the cavity trench of fill 203 is a cavity 706. Motion 811 of the second substrate 807 with respect to the first substrate 101 can change the pressure of a fluid in the cavity 706. A property of this fluid, such as its capacitance or resistance, can be monitored. Such monitoring can produce a signal indicative of the motion of the second substrate 807 with respect to the first substrate 101, for example indicating a change in pressure. Such a change in pressure can indicate a number of things, including that a nearby sound pressure wave generator is producing sound energy causing motion of the second substrate 807 with respect to the first substrate 101. Altitude can also be indicated. Thus, the second substrate 807 can provide an out-of-plane sense capacitor 809. A vacuum is applied to the cavity 706 during formation such that the cavity remains under vacuum in use. In various examples, a capacitive signal can be monitored by monitoring the motion of parallel plates from one another, such as by using the contacts 102, 102a to monitor motion of the second substrate 807 with respect to the first substrate 101.

An electrode to communicate the signal can be formed by device substrate 807 connected through a conductive substrate 101 bond to a first contact 102 coupled to the outer portion and another electrode can be formed by a second contact 102a coupled to the inner portion of the conductive first substrate 101.

Figure 9:
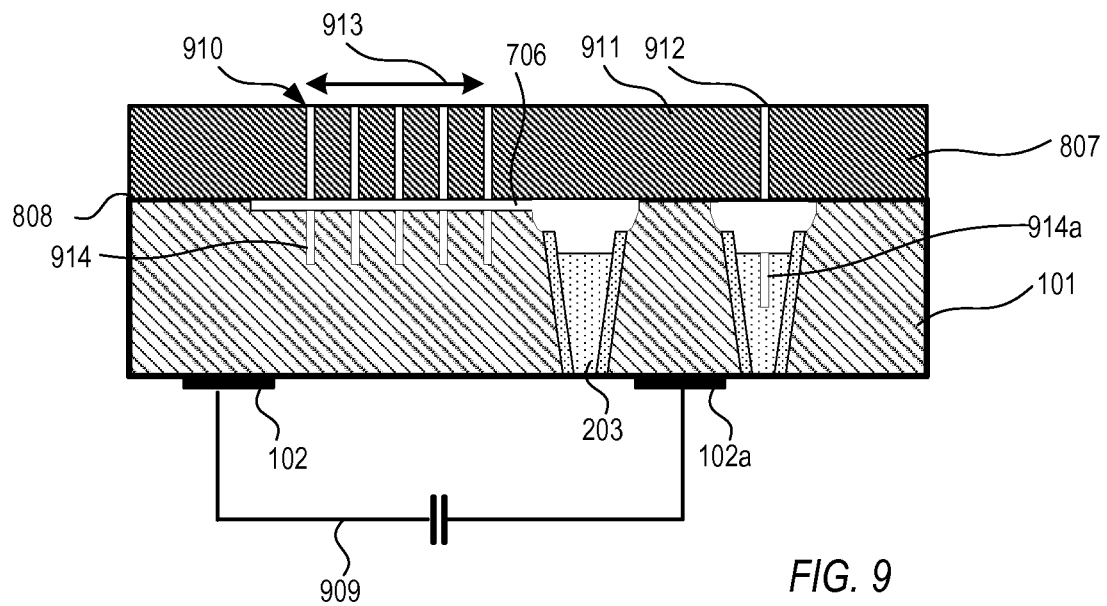
FIG. 9 illustrates a cross-section side-view of a device with a multi-material trench defining a perimeter covered by a device layer defining interdigitated fingers, according to an example.

FIG. 9 illustrates a cross-section side-view of a device with a multi-material trench defining a perimeter covered by a device layer defining interdigitated fingers, according to an example. The second substrate 807 can include an in-plane motion sensor, such as a motion sensing capacitor. An example of an in-plane motion sensing capacitor is disclosed in international patent application PCT/US2011/052061, which has a priority date of Sep. 18, 2010 a common assignee, and is incorporated herein by reference in its entirety. An in-plane motion sensing capacitor is disclosed in FIGS. 2 and 11, among others in that document.

The trench of fill 203 can define a circuit in the substrate 101, with an inner portion of the substrate being in the circuit, and an outer portion surrounding the circuit. Bonded to the inner portion is a cantilevered portion 911 of the second substrate 807, forming an electrode. The cantilevered electrode can include a comb-shaped electrodes shaped to interdigitated with a comb-shaped electrode of the remainder of the second substrate 807, such as by interlacing fingers belonging to each of comb-shaped electrode. Other configurations include, but are not limited to, parallel plates, parallel beams, gap-closing interdigitated fingers, friend-field capacitors, and combinations thereof. Motion 913 of the inner portion, such as motion of the cantilevered electrode 911, can provide an out-of-plane sense capacitor, such as by changing the distance between plates of the inner electrode and the outer electrode.

An electrode to communicate the signal can be formed by device substrate 807 connected through a conductive substrate 101 bond to a first contact 102 coupled to the outer portion and another electrode can be formed by a second contact 102a coupled to the inner portion of the conductive first substrate 101.

FIG. 10 illustrates a cross-section side-view of a device with a pressure transducer and a motion sensor, according to an example. In the example, a first cavity 1015 is configured to sense motion out of plane with the general shape of the second substrate 807. Formed as part of the second substrate 807 is the second cavity 1014 that can be used to sense configured to sense motion in the plane of the general shape of the second substrate 807. The first and second cavity can be defined by the same portions of the first 101 and second 807 substrate. One or more of the cavities 1014, 1015 can be formed in the first. One or more of the cavities 1014, 1015 can contain one or both via trenches 203, 203a. One or more of the cavities can be part of a cavity selectively etched into a top of the semiconductor substrate 101.

FIG. 11 illustrates a cross-section side-view of a device with a cavity disposed in the device layer, according to an example. One or both of the cavities 1115, 1114 can be formed in the second substrate 807. A cavity can comprise portions of the first substrate and the second substrate, however cavity thickness can affect sensitivity, and it is important to control the thickness of the cavity. It can be easier to control thickness of the cavity if it is disposed in one of the substrates, at least because of reducing stack-up error. Furthermore, placing the cavity in substrate 101, as in FIG. 10, makes manufacturing easier as there is no need for an aligned bond (fusion, anodic, adhesive, eutectic, or otherwise).

FIG. 12 illustrates a cross-section side-view of a device with multiple via substrates, according to an example. A third substrate 101a including at least one via comprising a trench of fill 203 can be disposed in the third substrate 101. The configuration sandwiches the second substrate 807 between two silicon substrates 101, 101a, such as similarly formed substrates. The contacts 203-203c can be interconnected to electronics to transmit signals generated by motion of the second substrate with respect to the first 101 and third 101a substrates. The configuration can alter the sensitivity of the device, at least by providing two signals that can be monitored to determine the nature of motion.

FIG. 13 illustrates a cross-section side-view of a device with a cap over the device layer, according to an example. A cap 1316 can be bonded 1317 to the device layer with at least one support structure that supports the cap. The cap can be bonded to the device layer using at least one of a silicon fusion process, a conductive metal process, a glass based process or an adhesive based process. The cap can be used to form a cavity 1318. The cap can provide a hermetic seal to seal a fluid such gas in the cavity 1318. Examples can include bonding a device layer to the substrate, and a cap to the device layer, with the cap, device layer and substrate defining a hermetically sealed chamber in which portions of the device chamber can be free to vibrate at lower frequencies than either of the cap and the substrate while one of the substrate, cap and device layer can be excited. Motion of the second substrate 807 with respect to one or both of the cap and the first substrate can provide signal information to the contacts 102, 102a that can be monitored by electronics. The cap can provide a cover to protect the second substrate 807.

Figure 14:
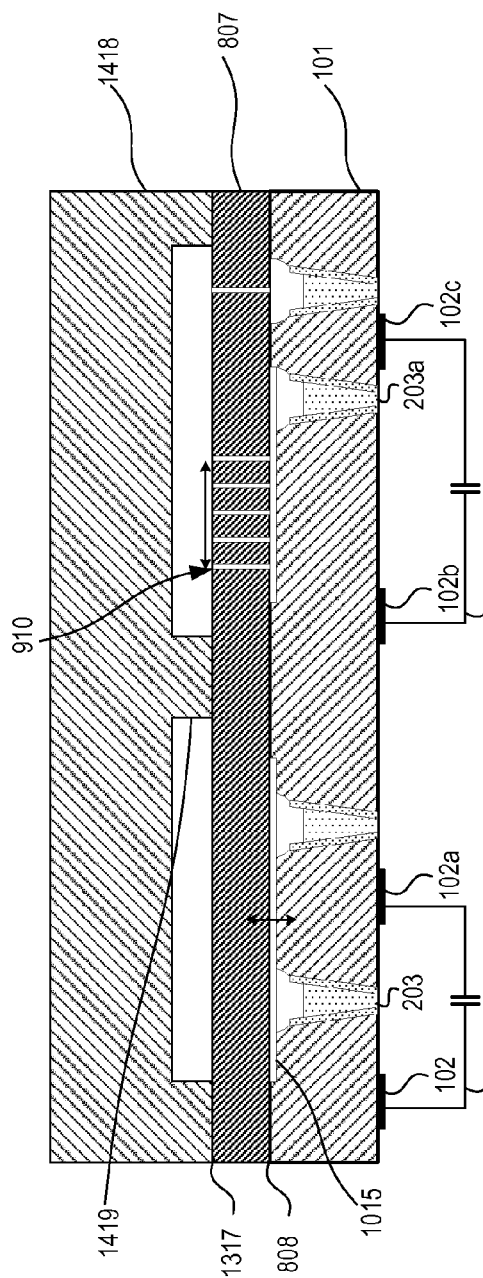
FIG. 14 illustrates a cross-section side-view of a device with a cap covering multiple devices portions of a device layer, according to an example.

FIG. 14 illustrates a cross-section side-view of a device with a cap covering multiple devices portions of a device layer, according to an example. A cap 1418 can include a support structure 1419 that can include one or more of structures such as pillars. Bonding can include bonding the pillars to the cap and the device layer with the same bond as the bond between the cap and the device layer. The support structure 1419 can reduce motion of the cap 1418 with respect to the second substrate 807. Such a reduction can reduce signal noise transmitted to the contacts 102, 102a such as by reducing translation of motion of the cap 1418 to motion of the second substrate 807. Further, a plurality of structures disposed between the cap and the device layer and resist bending of cap during the overmolding.

The support structures can form cavities, each sealable under different pressure and levels of hermiticity, with each cavity covering a device portion of the second substrate 807. A cavity can cover an acceleration sensor. A cavity can cover an ambient pressure sensor. A cavity can cover a gyroscope. Some or all of these can be formed out of the same first 101 and second 807 substrates.

Figure 15:
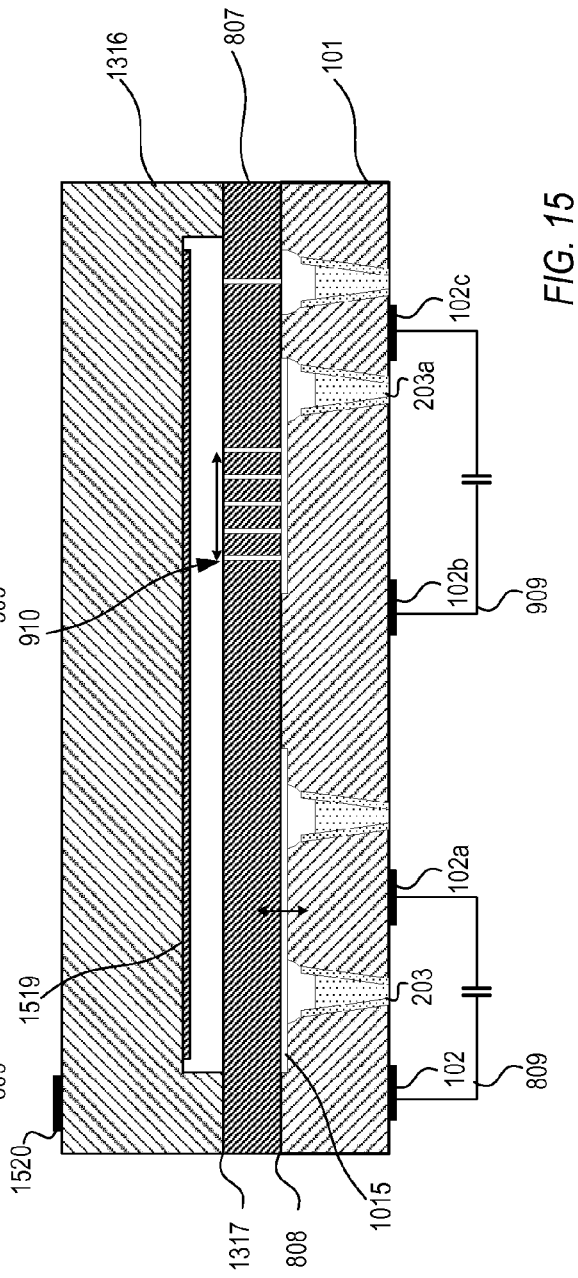
FIG. 15 illustrates a cross-section side-view of a device with a multi-material trench, according to an example.

FIG. 15 illustrates a cross-section side-view of a device with a multi-material trench, according to an example. At least one of the cavities can be coated with a conductor 1519 such as a metal and form a low resistivity electrode and electrostatic shield. Accordingly, motion of the cap 1316 with respect to the second substrate 807 can provide signal information to a contact 1520, such as when paired with monitored in conjunction with the monitoring of another contact 102a. The cavity of the cap can be disposed on a side of the second substrate 807 opposite the side bonded to the first substrate 101.

Figure 16:
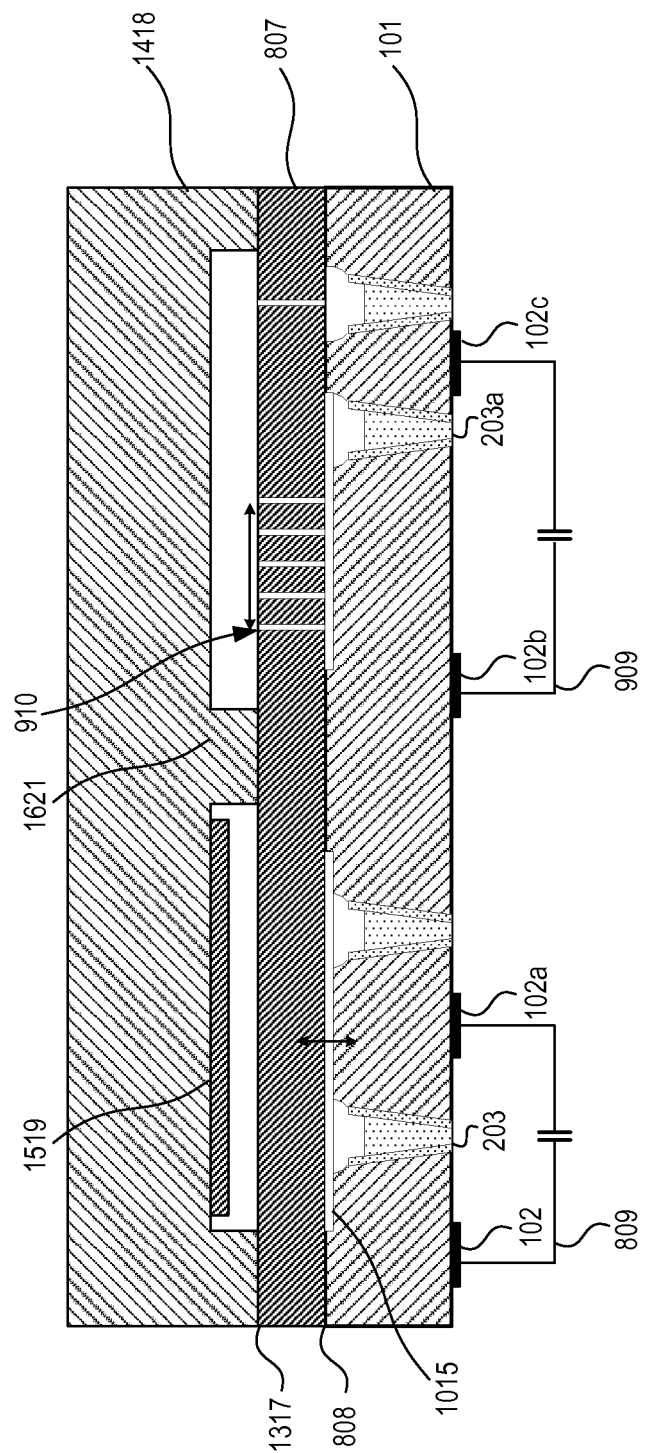
FIG. 16 illustrates a cross-section side-view of a device with a multi-material trench, according to an example.

FIG. 16 illustrates a cross-section side-view of a device with a multi-material trench, according to an example. The example combines a support structure 1621 with a cavity including a conductor, so a portion of the second substrate 807 or device layer can transmit a signal such as to a conductor coupled to the cap 1418.

Figure 17:
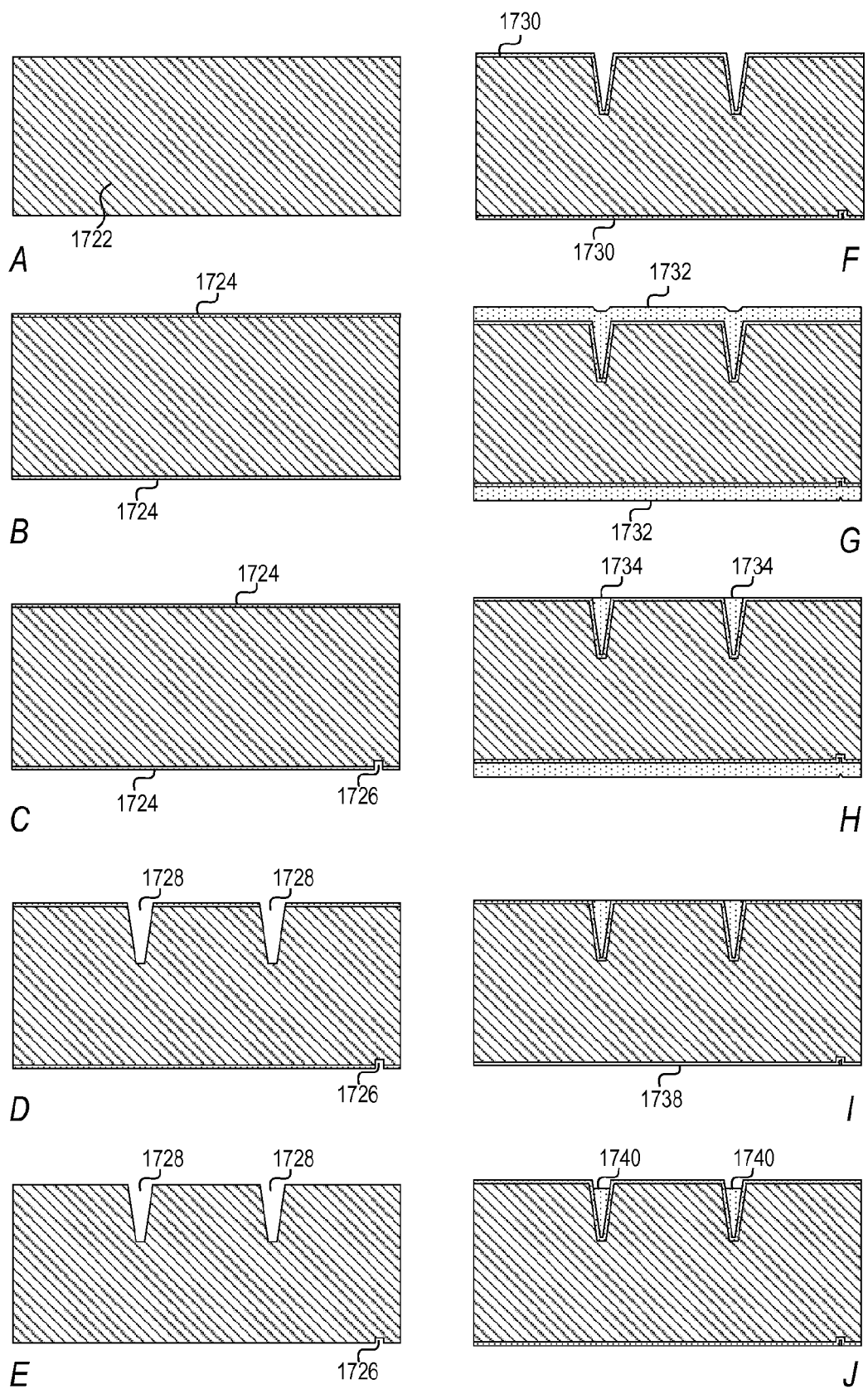
FIG. 17 illustrates a process illustrated by iterative views of an example semiconductor, according to an example.
Figure 17:
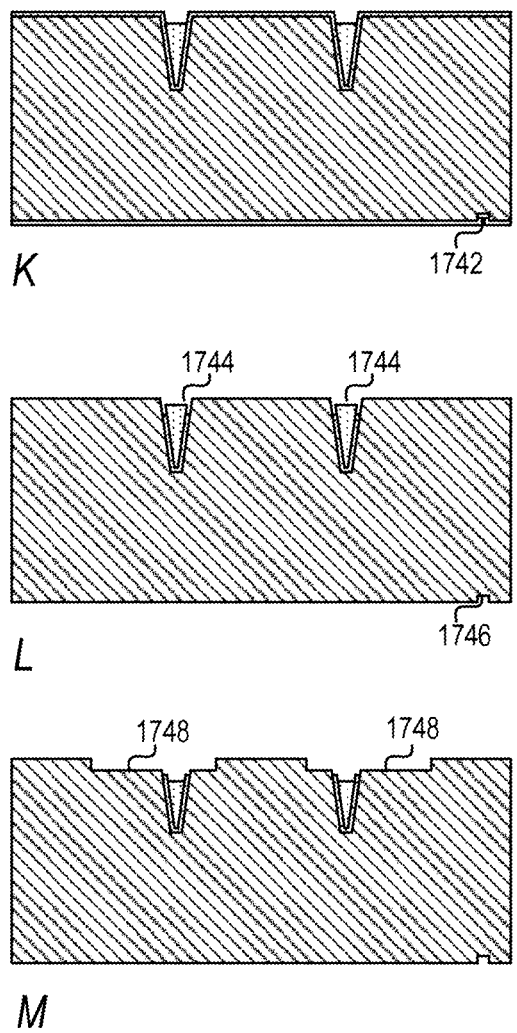

FIG. 17 illustrates a process illustrated by iterative views of an example semiconductor, according to an example.

At A, a wafer 1722, such as a double sided polished wafer is provided. The wafer can be formed of single crystal silicon, <100>. The wafer can be prime wafer. The wafer can exhibit a resistivity of 10-20 mOhm-cm. The wafer can be formed of P-type Boron or N-type Phosphorus. The wafer can have a roughness of less than or equal to 20 A. The wafer can have a total thickness variation of less than 3 µm. The wafer can be of a foundry standard thickness of greater than 200 µm.

The wafer can be subjected to a furnace pre-clean. The wafer can be subjected to a hydrofluoric acid (HF) dip. The HF dip can be followed by an RCA clean. The surface can be inspected to detect whether an SC1 clean roughens a surface of the wafer undesirably.

At B, the wafer can be thermally oxidized, such as through a wet process, growing an oxide layer 1724 of 1 µm+/−0.2 µm. The oxide can protect a non-scribe surface.

At C, a photoresist (PR) can be deposited and can be used to expose an alignment feature 1726, such as on a scribe-side of the wafer. The feature can be used to provide alignment to reduce instances of overhang of wafer edges after bond steps. Such overhang can result in edge chips and scrapped wafers. RIE etch can be applied to the oxide on scribe side (SS). The etch can stop on silicon, such as at around 1 µm. A RIE Etch of the silicon on SS can be 0.5 µm+/−0.1 µm.

At D, oxide can be stripped, such as by completely removing the oxide. A hydrofluoric acid (HF) dip can be used. A PR can be applied. A via trench 1728 can be exposed. A DRIE etch can be applied to the silicon, such as to provide a continuously tapered profile. Blow out and lip under oxide hard mask can be avoided. A less than 500 nanometer DRIE scallop can be created. If a silicon lip remains under an oxide hard mask, a two-stage DRIE can be used, including a shallow isotropic etch and a main DRIE.

At E, a polymer can be removed, and pre-furnace cleaning can be used to clean the wafer. It can be helpful to remove PR from the via trench over a long time and use a long clean. An SRD can be used to fully dry the wafers. Small water droplets that have been trapped in Vias can be removed using appropriate SRD cycle length. If droplets remain on the wafer surface, they can oxidize and create small surface protrusions during liner oxidation.

At F, the wafer can be thermally oxidized 1730, such as through a wet process, growing an oxide layer 1724 of 2 μm+/−0.2 μm. Possible oxide thickness range from 0.5 μm to 3.0 μm.

At G, low pressure chemical vapor deposition (LPCVD) can be used to deposite polysilicon 1732, such as at a thickness of 3.25 μm+/−0.4 μm. The deposit 1732 can include conformal, undoped, fine grain polysilicon deposited at from around 575 degrees Celsius to around 585 degrees Celsius. The deposition thickness can be enough to completely fill a via trench.

At H, chemical-mechanical planarization (CMP) can be used to remove polysilicon from all or a portion of the silicon, such as to expose top portions 1734 of the through-silicon-via. Removal can be directed toward the non-scribe side (NSS).

At I, chemical-mechanical planarization (CMP) can be used to remove polysilicon from all or a portion of the silicon. Removal can be directed toward the scribe side (SS). Removal can stop on the oxide layer 1738.

At J, a DRIE etch of the poly-silicon can be performed on the NSS, such as at 4 μm+/−0.5 μm. An isotropic etch can be used. The fill can be recessed below the upper surface. Depth can be measured with a profilometer.

At K, a DRIE etch of the poly-silicon can be performed on the SS, such as at 4 μm+/−0.5 μm. An isotropic etch can be used. The etch can removes stringers from the align feature 1742.

At L, the wafer can be cleaned with an $O_2$ wafer clean, such as to remove organic polymers. A wet oxide etch, such as of 2 μm+/−0.2 μm, can be performed, such as to remove surface oxide. The etch can recess oxide to around 1 μm below poly-Si surface. The etch can remove oxide to about 4 μm below the upper surface of the wafer, defining recesses 1740. Recesses 1744 can be define thus.

At M, a PR can be deposited and an electrode gap 1748 can be exposed on the NSS. An RIE or DRIE etch of the silicon on NSS can be performed, such as 2 μm+/−0.2 μm. The PR can be stripped, and the gap thickness can be verified with a profilometer. It can be helpful to remove PR from the via trench over a long time and use a long clean. An SRD can be used to fully dry the wafers. Small water droplets that have been trapped in vias can be removed using appropriate SRD cycle length. If droplets remain on the wafer surface, they can oxidize and create small surface protrusions during drying.

Removal of topography (particles, poly-Si, oxide, etc.) from wafer surfaces can be beneficial, such as to ensure that device function does not interfere with such topography.

Figure 18:
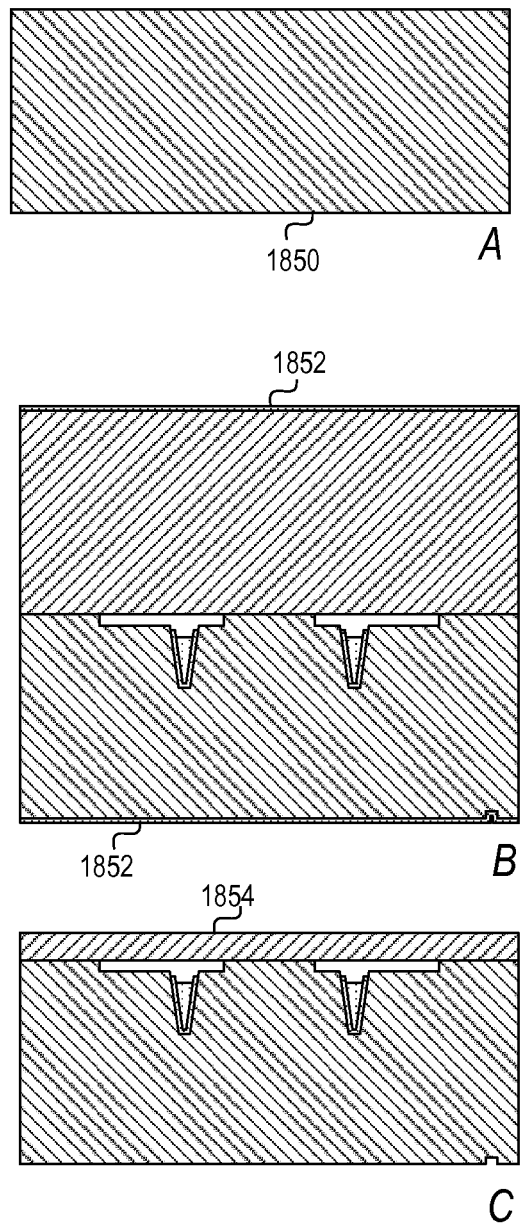
FIG. 18 illustrates a process including fusion bonding, according to an example.

FIG. 18 illustrates a process including fusion bonding, according to an example.

At A, a wafer 1850, such as a double sided polished wafer is provided. The wafer can be formed of single crystal silicon, such as with an orientation of <100>. The wafer can be prime wafer. The wafer can exhibit a resistivity of 10-20 mOhm-cm. The wafer can be formed of P-type Boron. The wafer can have a roughness of less than or equal to 20 A. The wafer can have a total thickness variation of less than 3 μm. The wafer can be of a foundry standard thickness of greater than 200 μm.

Pre-fusion bond activation can be applied to one or both the device and via wafers. Sulfuric acid can be used, followed by SC1 RCA clean, and finished with HF.

At B, layers can be grossly aligned. A fusion bond anneal and oxidation can be performed, such as at a temperature of at least 1100 C, with greater than 1200 C used in some examples. Oxide 1852 thickness can be created at around 1 μm+/−0.1 μm. Bond integrity can be monitored with SAM (Scanning Acoustic Microscopy) and wafer level infrared (IR).

At C, the a top substrate can be ground and a CMP can be applied to the NSS. The device layer 1854 thickness can be 60 μm+/−2 μm.

As discussed above, during certain steps, removal of topography (particles, poly-Si, oxide, etc.) from wafer surfaces can be beneficial, such as to ensure that device function does not interfere with such topography.

Figure 19:
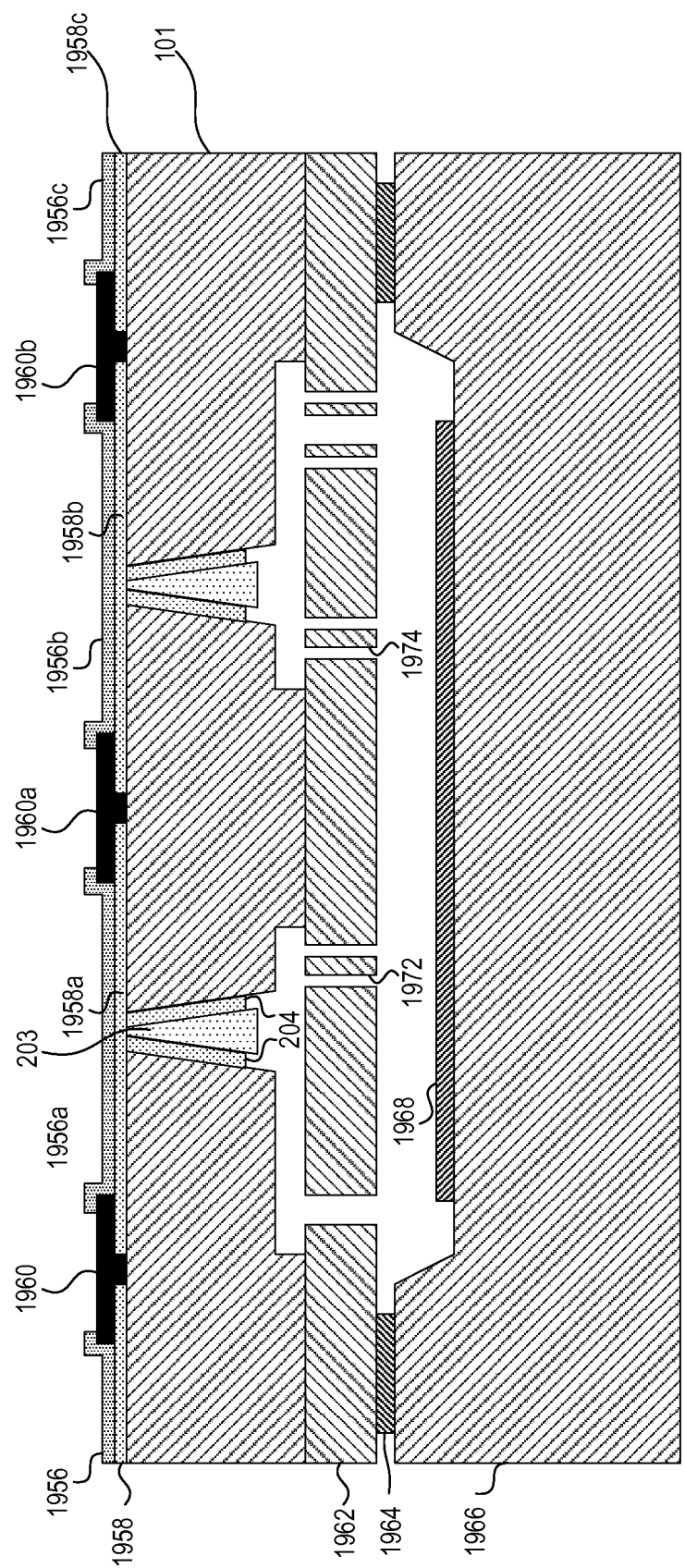
FIG. 19 illustrates a cross-section side-view of an optional semiconductor device configured to measure motion, according to an example.

FIG. 19 illustrates a cross-section side-view of an optional semiconductor device configured to measure motion, according to an example. In the example, a first substrate 101 includes vias formed therethrough, with a device layer 1962 bonded thereto. The device layer 1962 includes two in-plane sensors 1972, 1974 configured to provide a signal to the contacts 1960. In the example, differential motion between the sensors produces a signal indicative of the differential motion. Accordingly, the sensors can have different mass and/or a different number or total area of electrodes. A conductor 1968 is applied to a cap 1966 that covers the sensors to create a sealed cavity. The conductor 1968 can form a part of a contact to provide differential signal information. A covering 1956 covers a portion of the contacts 1960 and a dielectric layer 1958. In an example, the contacts 1960 are built up by etching the dielectric layer over portions of the silicon 101 to be used for conducting a signal.

ADDITIONAL NOTES

The present subject matter may be described by way of several examples. Example 1 can include subject matter (such as an system, apparatus, method, tangible machine readable medium, etc.) that can include electrically isolating vias disposed in substrate that can be created in a manner so as to provide a hermetic seal between the top of the via and the bottom of the via. Optionally, the example can maintain 10 mTorr vacuum over an extended time.

In Example 2 a system or apparatus can include, or can optionally be combined with any portion or combination of any portions of Example 1 to include vias formed by deep reactive-ion etching (DRIE) trench, that can be lined with dielectric, and that can be filled with material such that there are few or no voids.

In Example 3 a system or apparatus can include, or can optionally be combined with any portion or combination of any portions of any one or more of Examples 1-2 wherein the fill includes polysilicon or semiconductor and dielectric. In some examples the fill includes not just dielectric.

In Example 4 a system or apparatus can include, or can optionally be combined with any portion or combination of any portions of any one or more of Examples 2-3 wherein the fill includes thermal oxide.

In Example 5 a system or apparatus can include, or can optionally be combined with any portion or combination of any portions of any one or more of Examples 2-4 wherein the fill includes tetraethylorthosilicate (TEOS) or other low temperature oxide.

In Example 6 a system or apparatus can include, or can optionally be combined with any portion or combination of any portions of any one or more of Examples 1-5 in which poly can be 580 degree Celsius LPCVD polysilicon, undoped (e.g., super-conformal, fine grain polysilicon).

In Example 7 a system or apparatus can include, or can optionally be combined with any portion or combination of any portions of any one or more of Examples 2-6 such that a DRIE trench can be tapered in cross-section.

In Example 8 a system or apparatus can include, or can optionally be combined with any portion or combination of any portions of Example 7 such that a DRIE trench has widened mouth, or "mouth", formed of SCS (single crystal silicon).

In Example 9 a system or apparatus can include, or can optionally be combined with any portion or combination of any portions of Example 8 wherein "mouth" can be formed via isotropic etch (e.g., plasma, XeF2, wet etch, etc., and combinations thereof) or a highly tapered DRIE etch.

In Example 10 a system or apparatus can include, or can optionally be combined with any portion or combination of any portions of any one or more of Examples 1-9 wherein top and bottom critical dimensions (CDs) of trench can be less than 30 µm, and depth of etch can be 5 µm to 500 µm In Example 11 a system or apparatus can include, or can optionally be combined with any portion or combination of any portions of any one or more of Examples 2-10 wherein dielectric can be recessed below substrate surface In Example 12 a system or apparatus can include, or can optionally be combined with any portion or combination of any portions of any one or more of Examples 2-11 wherein fill can be recessed below substrate surface.

In Example 13 a system or apparatus can include, or can optionally be combined with any portion or combination of any portions of any one or more of Examples 2-12 wherein the trench forms one or more loops.

In Example 14 a system or apparatus can include dielectrically isolating and hermetic sealing one or more vias in a substrate, with a cavity selectively etched into the substrate surface, the cavity encompassing at least a portion of the one or more vias.

In Example 15 a system or apparatus can include, or can optionally be combined with any portion or combination of any portions of the Example 14 wherein the cavity can be between 0.001 µm and 1000 µm in depth.

In Example 16 a system or apparatus can include, or can optionally be combined with any portion or combination of any portions of any one or more of Examples 14-15, wherein one or more vias can be created first, followed by the creation of the cavity.

In Example 17 a system or apparatus can include, or can optionally be combined with any portion or combination of any portions of any one or more of Examples 14-16 wherein cavity can be created first, followed by the creation of one or more vias.

In Example 18 a system or apparatus can include, or can optionally be combined with any portion or combination of any portions of any one or more of Examples 14-17 wherein vias can be completely contained within the cavity.

In Example 19 a system or apparatus can include, or can optionally be combined with any portion or combination of any portions of any one or more of Examples 14-19 wherein cavity edge to via spacing can be no less than 5 µm.

In Example 20 a system or apparatus can include, or can optionally be combined with any portion or combination of any portions of any one or more of Examples 1-13 can be combined with any one or more of claims 14-19.

Example 21 can include subject matter (such as an system, apparatus, method, tangible machine readable medium, etc.) that can include electrically isolating and hermetically sealing vias in a substrate ("via substrate"), with a cavity selectively etched into one or both of a substrate surface, and a second substrate ("device substrate") that is bonded to the via substrate.

In Example 22 a system or apparatus can include, or can optionally be combined with any portion or combination of any portions of Example 21 in which one or more of the substrates can be formed of single crystal silicon (SCS).

In Example 23 a system or apparatus can include, or can optionally be combined with any portion or combination of any portions of any one or more of Examples 21-22 in which at least one of the bonds includes a fusion bond (hydrophobic, hydrophilic, etc.).

In Example 24 a system or apparatus can include, or can optionally be combined with any portion or combination of any portions of any one or more of Examples 21-23 in which at least one bond includes a eutectic bond, anodic bond, or adhesive bond.

In Example 25 a system or apparatus can include, or can optionally be combined with any portion or combination of any portions of any one or more of Examples 21-24 in which the device substrate can be between the thicknesses of 2 µm and 1000 µm.

In Example 26 a system or apparatus can include, or can optionally be combined with any portion or combination of any portions of any one or more of Examples 21-25 in which device substrate can be between the thicknesses of 2 µm and 1000 µm.

In Example 27 a system or apparatus can include, or can optionally be combined with any portion or combination of any portions of any one or more of Examples 2-19 can optionally be combined with any portion or combination of any portions of any one or more of Examples 21-26.

Example 28 can include subject matter (such as an system, apparatus, method, tangible machine readable medium, etc.) that can include an out-of-plane (e.g., moving vertically) sense capacitor, wherein one electrode can be formed by a device substrate connected through a conductive wafer bond to a contact coupled to the TSV substrate inside the TSV trench, and another electrode can be formed by a contact coupled to the TSV substrate outside the TSV trench, wherein contact 1 and contact 2 can be isolated using a via described in any one of claims 1-27.

In Example 29 can include subject matter (such as a system, apparatus, method, tangible machine readable medium, etc.) that can include an in-plane (e.g., moving horizontally) sense capacitor, e.g. a capacitor including a comb, wherein one electrode can be formed by a device substrate connected through a conductive wafer bond to a contact coupled to the TSV substrate inside the TSV trench, and another electrode can be formed by a contact coupled to the TSV substrate outside the TSV trench, wherein contact 1 and contact 2 can be isolated using a via described in any one of claims 1-27.

In Example 30 a system or apparatus can include, or can optionally be combined with any portion or combination of any portions of any one or more of Examples 1-29, including in-plane and out-of plane sense capacitors fabricated on the same device substrate using TSV defined in any one of the above claims.

In Example 31 a system or apparatus can include, or can optionally be combined with any portion or combination of any portions of any one or more of Examples 1-20, but with gaps fabricated on the device layer.

In Example 32 a system or apparatus can include, or can optionally be combined with any portion or combination of any portions of any one or more of Examples 1-31, but with TSV on the other side of device layer.

In Example 33 a system or apparatus can include, or can optionally be combined with any portion or combination of any portions of any one or more of Examples 1-32, but with TSVs on both sides of device layer.

In Example 34 a system or apparatus can include, or can optionally be combined with any portion or combination of any portions of any one or more of Examples 1-33, but with a cap bonded to the other side of device substrate.

In Example 35 a system or apparatus can include, or can optionally be combined with any portion or combination of any portions of any one or more of Examples 1-34 with cap bonded using silicon fusion process.

In Example 36 a system or apparatus can include, or can optionally be combined with any portion or combination of any portions of any one or more of Examples 1-35 with cap bonded using conductive metal process.

In Example 37 a system or apparatus can include, or can optionally be combined with any portion or combination of any portions of any one or more of Examples 1-36 with cap bonded using glass based process.

In Example 38 a system or apparatus can include, or can optionally be combined with any portion or combination of any portions of any one or more of Examples 1-37 with cap bonded using adhesive based process.

In Example 39 a system or apparatus can include, or can optionally be combined with any portion or combination of any portions of any one or more of Examples 1-38, but with cap having one or more cap support structures in a form of pillar, any one of which can reduce bending of cup during plastic overmolding, wherein the bond between pillars and device layer can be the same as between cap and device layer.

In Example 40 a system or apparatus can include, or can optionally be combined with any portion or combination of any portions of any one or more of Examples 1-39, but wherein one or more cap Support structures form cavities, each sealed under different pressure and/or different levels of hermiticity, to optimize performance of different devices, such as acceleration sensors sealed at ambient pressure and gyroscopes sealed under vacuum.

In Example 41 a system or apparatus can include, or can optionally be combined with any portion or combination of any portions of any one or more of Examples 1-40, but with a cap having at least one of the cavities coated with metal to form a low resistivity electrode and electrostatic shield.

In Example 42 a system or apparatus can include, or can optionally be combined with any portion or combination of any portions of any one or more of Examples 1-41, with the fill consisting of 2 or more materials.

Each of these non-limiting examples can stand on its own, or can be combined in various permutations or combinations with one or more of the other examples.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. An apparatus comprising:
a substrate including at least one via disposed in the substrate, wherein the substrate comprises:
a trench having a substantially trapezoidal cross-section, the trench extending through the substrate between a lower surface of the substrate and an upper surface of the substrate, wherein the top of the trench opens to a top opening, and the bottom of the trench opens to a bottom opening, the top opening being larger than the bottom opening; and
a mouth surrounding the top opening and extending between the upper surface and the top opening, wherein a mouth opening in the upper surface is larger than the top opening of the trench,
a second substrate bonded to the substrate;
wherein the via comprises:
a dielectric layer disposed on an inside surface of a trench; and
a fill disposed in the trench, with the dielectric layer sandwiched between the fill and the substrate,
wherein the trench defines a circuit in the substrate, with an inner portion of the substrate being in the circuit, and an outer portion surrounding the circuit,
wherein the second substrate includes a sense capacitor, wherein one electrode is formed by a device substrate connected through a conductive substrate bond to a first contact coupled to the inner portion and another electrode is formed by a second contact coupled to the outer portion.

2. The apparatus of claim 1, wherein the substrate is formed of single crystal silicon.

3. The apparatus of claim 1, wherein the fill and the dielectric are sealed to the substrate hermetically.

4. The apparatus of claim 1, wherein the trench tapers narrower in cross-section from the top opening to the bottom opening.

5. The apparatus of claim 1, wherein the via is substantially void free.

6. The apparatus of claim 1, wherein the fill includes at least one of polysilicon or a combination of semiconductor and dielectric.

7. The apparatus of claim 1, wherein the dielectric is recessed below substrate surface.

8. The apparatus of claim 1, wherein the fill is recessed below the upper surface.

9. The apparatus of claim 1, wherein the sense capacitor includes an out-of-plane sense capacitor.

10. The apparatus of claim 1, wherein the sense capacitor includes an in-plane sense capacitor.

11. The apparatus of claim 10, wherein the in-plane sense capacitor includes a comb including interdigitated fingers.

12. The apparatus of claim 10, wherein the second substrate includes an out-of-plane sense capacitor.

13. The apparatus of claim 1, comprising a third substrate including at least one via disposed in the third substrate, wherein the third substrate comprises:
a trench having a substantially trapezoidal cross-section, the trench extending through the third substrate between a lower surface of the third substrate and an upper surface of the third substrate, wherein the top of the trench opens to a top opening, and the bottom of the trench opens to a bottom opening, the top opening being larger than the bottom opening; and
a mouth surrounding the top opening and extending between the upper surface and the top opening, wherein a mouth opening in the upper surface is larger than the top opening of the trench, and
wherein the via comprises:
a dielectric layer disposed on an inside surface of a trench; and
a fill disposed in the trench, with the dielectric layer sandwiched between the fill and the third substrate.

14. The apparatus of claim 1, comprising a cap bonded to an opposite side of second substrate bonded to the second substrate with at least one support structure that supports the cap.

15. The apparatus of claim 14, wherein the support structure is one of a plurality of support structures and includes a pillar.

16. The apparatus of claim 15, wherein the plurality of support structures form cavities, each sealable under different pressure and/or different levels of hermiticity, with each cavity covering a device portion of the second substrate.

17. The apparatus of claim 16, wherein a first cavity covers an acceleration sensor, a second cavity covers an ambient pressure and a third cavity covers a gyroscope.

18. The apparatus of claim 1, wherein the inner portion is dielectrically isolated from the outer portion.

19. The apparatus of claim 1, wherein each of the top opening and the bottom opening are less than 30 μm across, and distance between them is from 5 μm to 500 μm.

20. The apparatus of claim 1, wherein the upper surface is part of a cavity selectively etched into a top of the semiconductor substrate.

21. The apparatus of claim 20, wherein the top opening and the mouth are disposed within the cavity.

22. The apparatus of claim 20, wherein the cavity includes a cavity edge, and wherein the cavity edge to via spacing is no less than 5 μm.

* * * * *